US011079418B2

(12) United States Patent
Bernsee et al.

(10) Patent No.: US 11,079,418 B2
(45) Date of Patent: Aug. 3, 2021

(54) METHODS FOR EXTENDING FREQUENCY TRANSFORMS TO RESOLVE FEATURES IN THE SPATIO-TEMPORAL DOMAIN

(71) Applicant: Zynaptiq GmbH, Hannover (DE)

(72) Inventors: Stephan M. Bernsee, Karlsruhe (DE); Denis Gökdag, Hannover (DE)

(73) Assignee: ZYNAPTIQ GMBH, Hanover (DE)

( * ) Notice: Subject to any disclaimer, the term of this patent is extended or adjusted under 35 U.S.C. 154(b) by 964 days.

(21) Appl. No.: 15/558,996

(22) PCT Filed: Mar. 17, 2016

(86) PCT No.: PCT/EP2016/000477
§ 371 (c)(1),
(2) Date: Sep. 15, 2017

(87) PCT Pub. No.: WO2016/146265
PCT Pub. Date: Sep. 22, 2016

(65) Prior Publication Data
US 2018/0238943 A1    Aug. 23, 2018

Related U.S. Application Data

(60) Provisional application No. 62/134,314, filed on Mar. 17, 2015.

(51) Int. Cl.
*G01R 23/167*    (2006.01)
*G06F 17/14*    (2006.01)

(52) U.S. Cl.
CPC ......... *G01R 23/167* (2013.01); *G06F 17/141* (2013.01)

(58) Field of Classification Search
CPC .......................... G01R 23/167; G06F 17/141
See application file for complete search history.

(56) References Cited

U.S. PATENT DOCUMENTS 8,706,511 B2    4/2014  Taleb
2018/0133431 A1*  5/2018  Malchano ............ A61B 5/0036
2019/0019331 A1*  1/2019  Alliez ................. G06T 17/205

OTHER PUBLICATIONS

Seelamantula et al., "Blocking artifacts in speech/audio: Dynamic auditory model-based characterization and optimal time-frequency smoothing," Signal Processing, 2009, pp. 523-531, vol. 89 (Year: 2009).*

(Continued)

*Primary Examiner* — Manuel A Rivera Vargas
*Assistant Examiner* — Yaritza H Perez Bermudez
(74) *Attorney, Agent, or Firm* — Dorsey & Whitney LLP

(57) ABSTRACT

A signal processing method generates a time-frequency domain representation of an input signal for the purpose of signal detection, signal display, and application of filtering operations, such as sample accurate spectral editing. The method may include receiving an input signal in the time domain in a processor. The input signal may include a plurality of transform frames. The input signal is transformed into the frequency domain using a frequency transform. Time-frequency matrices are generated from the frequency transform. Crossfrequency phase coupling is applied between adjacent frequency bins to introduce synchronization between adjacent frequencies and to generate smoothed time-frequency matrices with sample-accurate frequency magnitudes. The frequency information can be edited in the time-frequency domain specific to a single sample of the transform frame to alter unwanted signal features. A modified time domain representation of the edited input signal can be generated from the modified time-frequency matrices.

22 Claims, 23 Drawing Sheets

(56) References Cited

OTHER PUBLICATIONS

International Search Report and Written Opinion for International Patent Application No. PCT/EP2016/000477, dated Jun. 17, 2016 (13 Pages).

Ghoraani et al., "Time-Frequency Matrix Feature Extraction and Classification of Environmental Audio Signals," IEEE Transactions on Audio, Speech, and Language Processing, Sep. 2011, pp. 2197-2209, vol. 19, No. 7.

Kawahara et al., "Restructuring speech representations using a pitch-adaptive time-frequency smoothing and an instantaneous-frequency-based F0 extraction: Possible role of a repetitive structure in sounds," Speech Communication, 1999, pp. 187-207, vol. 27.

Seelamantula et al., "Blocking artifacts in speech/audio: Dynamic auditory model-based characterization and optimal time-frequency smoothing," Signal Processing, 2009, pp. 523-531, vol. 89.

\* cited by examiner

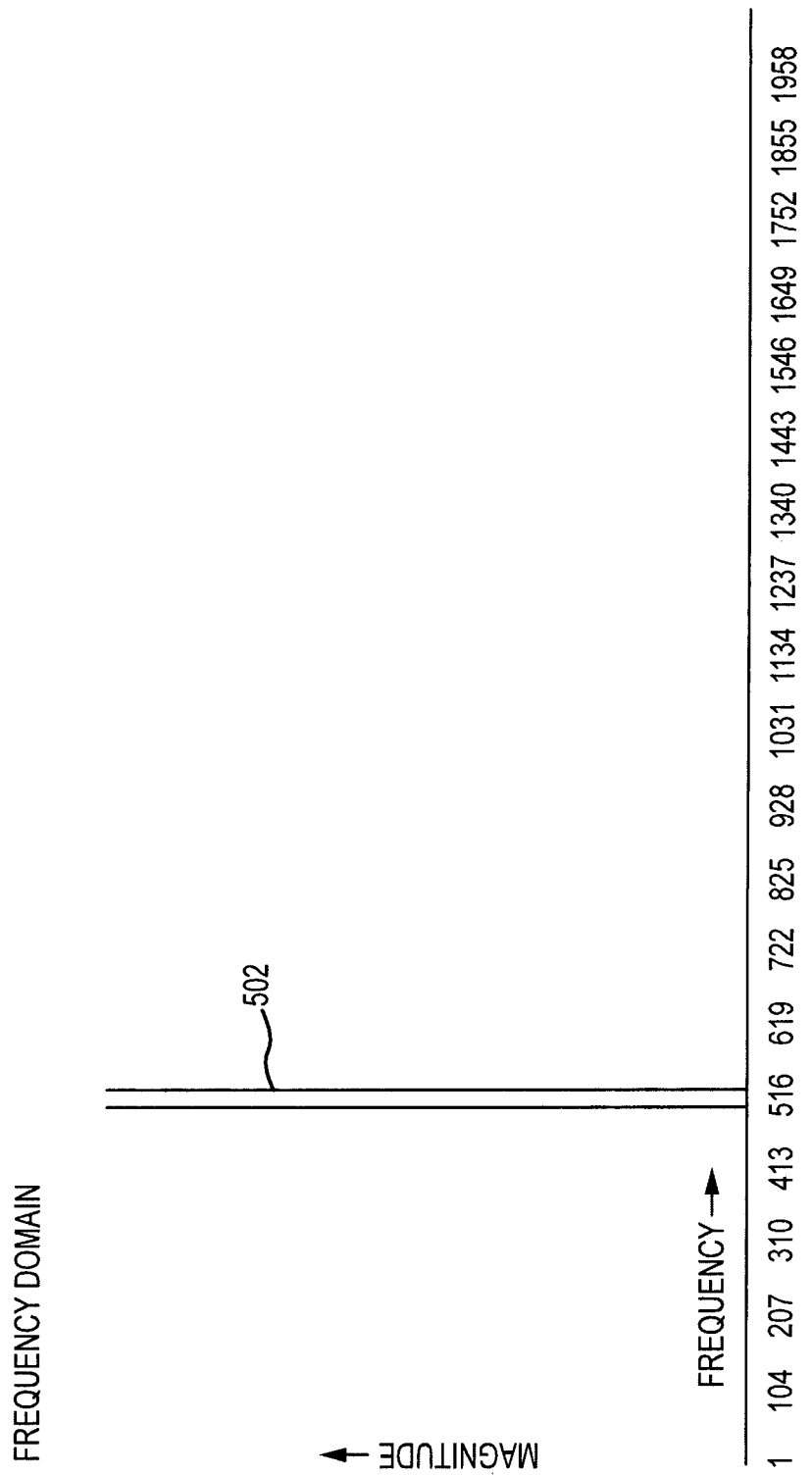

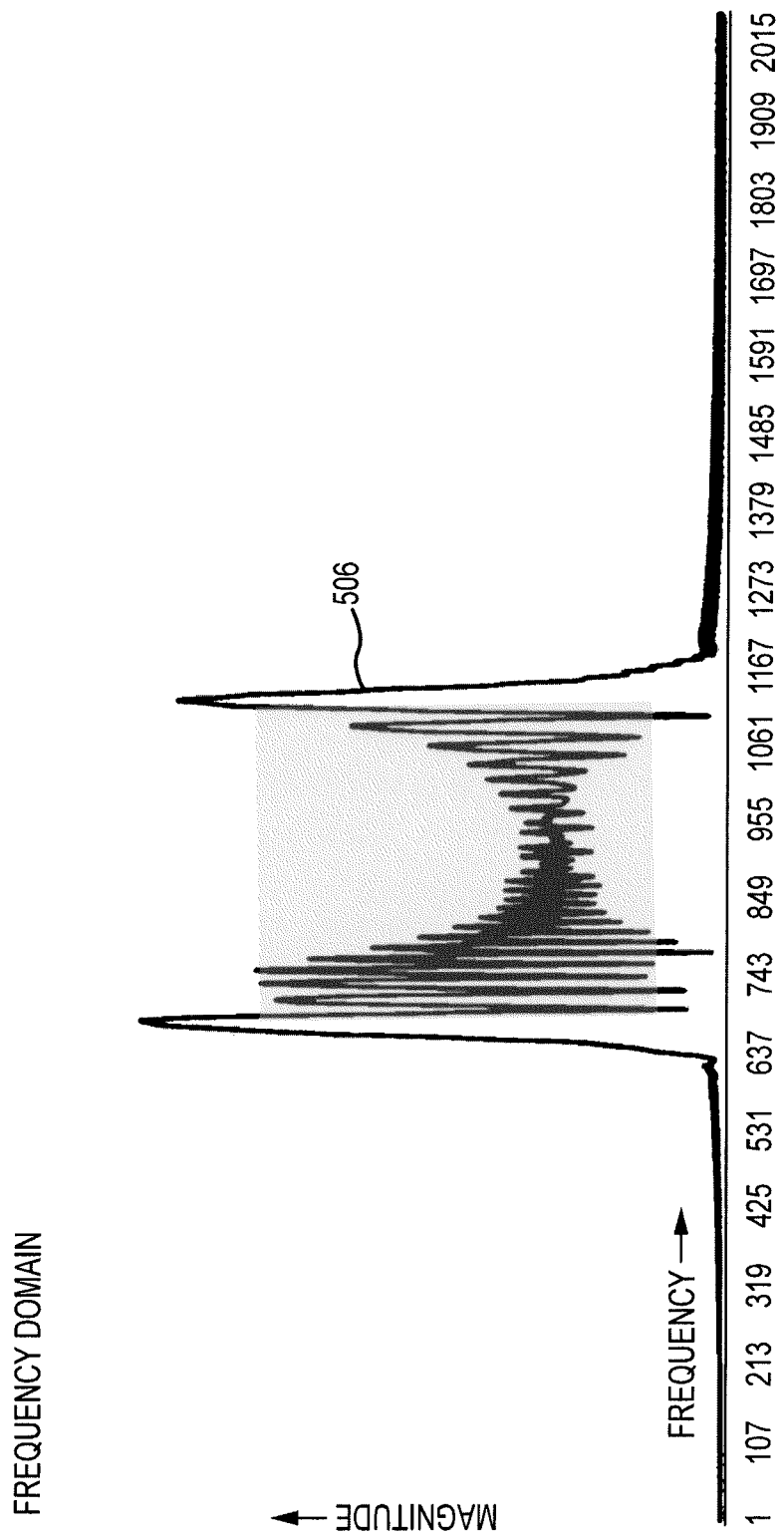

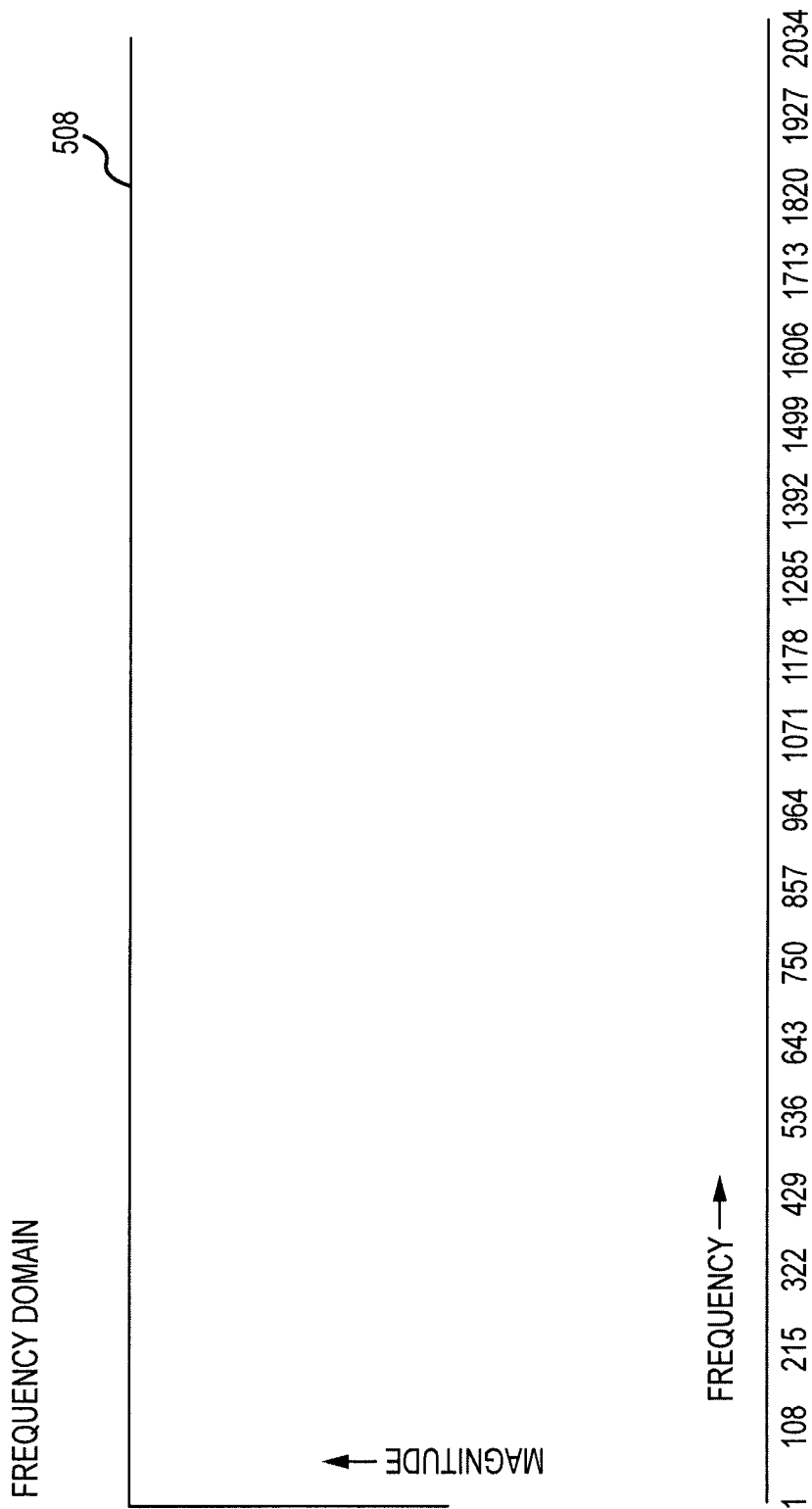

METHODS FOR EXTENDING FREQUENCY TRANSFORMS TO RESOLVE FEATURES IN THE SPATIO-TEMPORAL DOMAIN

CROSS-REFERENCE TO RELATED APPLICATIONS

This application is a U.S. National Stage entry under 35 U.S.C. § 371 of International Application No. PCT/EP2016/000477 filed on 17 Mar. 2016, which claims the benefit of priority to U.S. Provisional Application No. 62/134,314 filed on 17 Mar. 2015, each of which is hereby incorporated by reference in its entirety.

FIELD

The present disclosure is directed to signal processing, and more particularly, embodiments relate to frequency transform and modification of time domain signals, as well as applications to the analysis, modification, and synthesis of audio signals.

BACKGROUND

Various frequency transforms, including Fast Fourier Transform (FFT) and related transform algorithms, such as the sine and cosine transform, sparse Fast Fourier transform, Hartley transform, or Least-Squares Signal Analysis (LSSA) methods, are generally based on sinusoidal representations of a spatio-temporal electromagnetic signal. For example, frequency transforms have been employed in the past to transform a digitized input signal in the time domain into component frequencies in the frequency domain. Then, the component frequencies can be displayed or modified, such that a portion of the input signal can be suppressed, enhanced, or changed, or new signals can be generated. However, the conventional conversion into the frequency domain precludes simultaneous access to structural information of the input signal in the time domain.

When expressing a signal in the frequency domain as a sum of periodic waves such as sinusoids, frequency resolution and time resolution are reciprocal properties, a fact that is often compared to the effects of the Heisenberg uncertainty principle in physics, and also commonly called the Heisenberg uncertainty principle in signal processing. The number of time domain measurements of uniform duration ("samples") or the number of frequency measurements of uniform bandwidth in the frequency transform ("bins") determine both frequency resolution and time resolution within the analysis interval. High frequency resolution and high time resolution cannot be simultaneously obtained. For example, when the number of time domain measurements included in an analysis is high, the frequency transform is relatively large. Conversely, when the number of time domain measurements is low, the frequency transform is relatively small. The resulting frequency domain representation of the signal is an average across the entire analysis interval. Therefore, large transforms may result in good frequency resolution, but poor time resolution. Conversely, small transforms may provide good time resolution, but may sacrifice frequency resolution. The uncertainty principle limits the usefulness of frequency transforms for analyzing signals that are localized in time, notably transients, or any signal of finite extent.

There remains a need to develop methods to simultaneously provide high resolution in both frequency domain and spatio-temporal domain.

SUMMARY

As noted, signal processing methods are limited in their ability to provide "sample-accurate" frequency domain representations of an electromagnetic signal for analysis. "Sample-accurate" means that the frequency distribution for a particular or discrete signal sample (i.e., for one time increment in the transform frame) is as close to the actual frequency magnitude and phase of frequencies that exhibited energy at that particular instance of time as the signal propagates in the time domain. In reality, when the captured time frame of the signal is digitized and transformed by mathematical algorithms into the frequency domain, the frequency distribution is averaged across all sample increments of the time domain. Therefore, the resulting frequency analysis is not sample-accurate using a standard Fourier transform method. The process disclosed herein processes the digitized signal in such a way that frequency distributions in the frequency domain are tied to each of the discrete samples in the frame rather than averages over the entire frame.

This sample accurate result is achieved by creating a time-frequency matrix extension after the input signal has been transformed from the time domain to the frequency domain. Smoothing algorithms are then used to create cross frequency phase coupling between adjacent frequency bins across the entire frame. Local amplifications and cancellations occur such that events occurring synchronously across several frequencies at a particular time sample are revealed providing frequency resolution specific to each time sample in the frame. Signal editing can be performed in the thus-created time-frequency domain to provide frequency manipulation particular to a sample interval (i.e., sample-accurate analysis and editing).

In one implementation, a method for processing an electromagnetic signal to identify unwanted signal features in discrete signal samples includes the following operations. A particularly configured microprocessor generates a time-frequency representation of an input signal. This is achieved by first receiving the input signal as a plurality of transform frames in a time domain, wherein each transform frame includes a plurality of signal samples corresponding to discrete time instances across each transform frame. Each transform frame is then converted to a frequency domain using a frequency transform, wherein the input signal is represented on a grid of frequency bands by phase and magnitude measurements for each frequency band. Next, matrices are formulated with a frequency axis and a time axis containing sinusoidal waves corresponding to real and imaginary parts of the frequency, magnitude, and phase information across each transform frame, wherein each sinusoidal wave contains N time domain samples of the input signal. A smoothing filter is applied along the frequency axis of the matrices to introduce synchronization between adjacent frequency regions for each discrete signal sample to smooth the matrices along the frequency axis, such that the energy of waves from the adjacent frequency regions leak into each other. Unwanted signal features are thus magnified in corresponding frequency bands of the smoothed time-frequency representation for each time instance in which the unwanted signal features occurred in the input signal in the time domain. Then time-frequency magnitudes and phases are formulated from the smoothed matrices. Values or representations, or both, of the time-frequency magnitudes and phases that highlight unwanted signal features in individual frequency bands for discrete signal samples are output for storage in a memory device coupled to the microprocessor or displayed on a display device coupled to the microprocessor.

In addition, the time-frequency magnitudes may be modified via the microprocessor, which may further inversely transforming the modified time-frequency magnitudes and phases into a modified time domain representation of the input signal. The modified time domain representation so created may be output from the microprocessor. The time-frequency magnitudes may indicate an unwanted signal in the modified time-frequency magnitude. The magnitude or phase, or both, of the unwanted signal may be altered as part of the modifying process either through user input or via an automatic pattern detection process.

In another embodiment, a method for processing a digitized electromagnetic signal to identify unwanted signal features is implemented in a computer system. A particularly configured microprocessor generates a modified time-frequency representation of an input signal by performing the following operations. The input signal is received as a plurality of transform frames in a time domain in the microprocessor, wherein each transform frame includes a plurality of signal samples. Each transform frame of the input signal is transformed into a frequency domain using a frequency transform. A time dimension is introduced into the frequency transform to generate constant frequency and constant magnitude periodic partial waves for each frequency band of the frequency transform of the input signal for each of the transform frames to form a time-frequency representation for each transform frame. A smoothing filter is applied to the time-frequency representation to introduce synchronization between the periodic partial waves of adjacent frequency bands and to generate a smoothed time-frequency representation that includes non-periodic wave packets across the frequency bands converted from the periodic partial waves by the synchronization. Unwanted signal features are magnified in corresponding frequency bands of the smoothed time-frequency representation for each signal sample in which the unwanted signal features occurred in the input signal in the time domain. Time-frequency values are formulated from the non-periodic wave packets for each frequency band in each signal sample. The time-frequency values or representations thereof, or both, identifying the unwanted signal features in discrete time samples may then be displayed on a display device within the computer system. The time-frequency values may further be edited to modify unwanted signal features in the smoothed time-frequency representation. A modified time domain signal of the edited time-frequency values may be generated via the microprocessor and further displayed as a representation on a display device In a further embodiment, a non-transitory computer readable storage medium contains instructions for instantiating a special purpose computer to process a digitized electromagnetic signal to remove unwanted signal features from the electromagnetic signal. The instructions implement a computer process comprising the following steps. The input signal comprising a plurality of transform frames in a time domain is received. The input signal is transformed into a frequency domain using a frequency transform. Time-frequency matrices are generated corresponding to respective transform frames from the frequency transform containing basis functions of the frequency transform adjusted for respective transform magnitudes and phases. The time-frequency matrices have a first dimension of time in instances of sample time t and a second dimension of frequency in bandwidth bins k for each transform frame. A cross-frequency phase coupling processing algorithm may be applied between adjacent frequencies to introduce synchronization between the adjacent frequencies and to generate smoothed time-frequency matrices. Unwanted signal features are magnified in corresponding bandwidth bins k of the smoothed time-frequency matrices for each time sample t in which the unwanted signal features occurred in the input signal in the time domain. Time-frequency values or representations thereof, or both, from the smoothed time-frequency matrices identifying the unwanted signal features for relevant time samples t may be output for storage or for display on a display device. Modified time-frequency matrices may further be from the modified time-varying magnitudes and phases. A modified time domain signal of the input signal can be generated from the modified time-frequency matrices which reflect edits to the unwanted signal features. The modified time domain signal may further be output for storage or for display on a display device.

Additional embodiments and features are set forth in part in the description that follows and will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein:

FIG. 5A illustrates the magnitudes of the frequency transform of the first time component of the input signal of FIG. 2.

FIG. 5C illustrates the magnitudes of the frequency transform of the third time component of the input signal of FIG. 2.

FIG. 5D illustrates the magnitudes of the frequency transform of the fourth time component of the input signal of FIG. 2.

DETAILED DESCRIPTION

Figure 1:
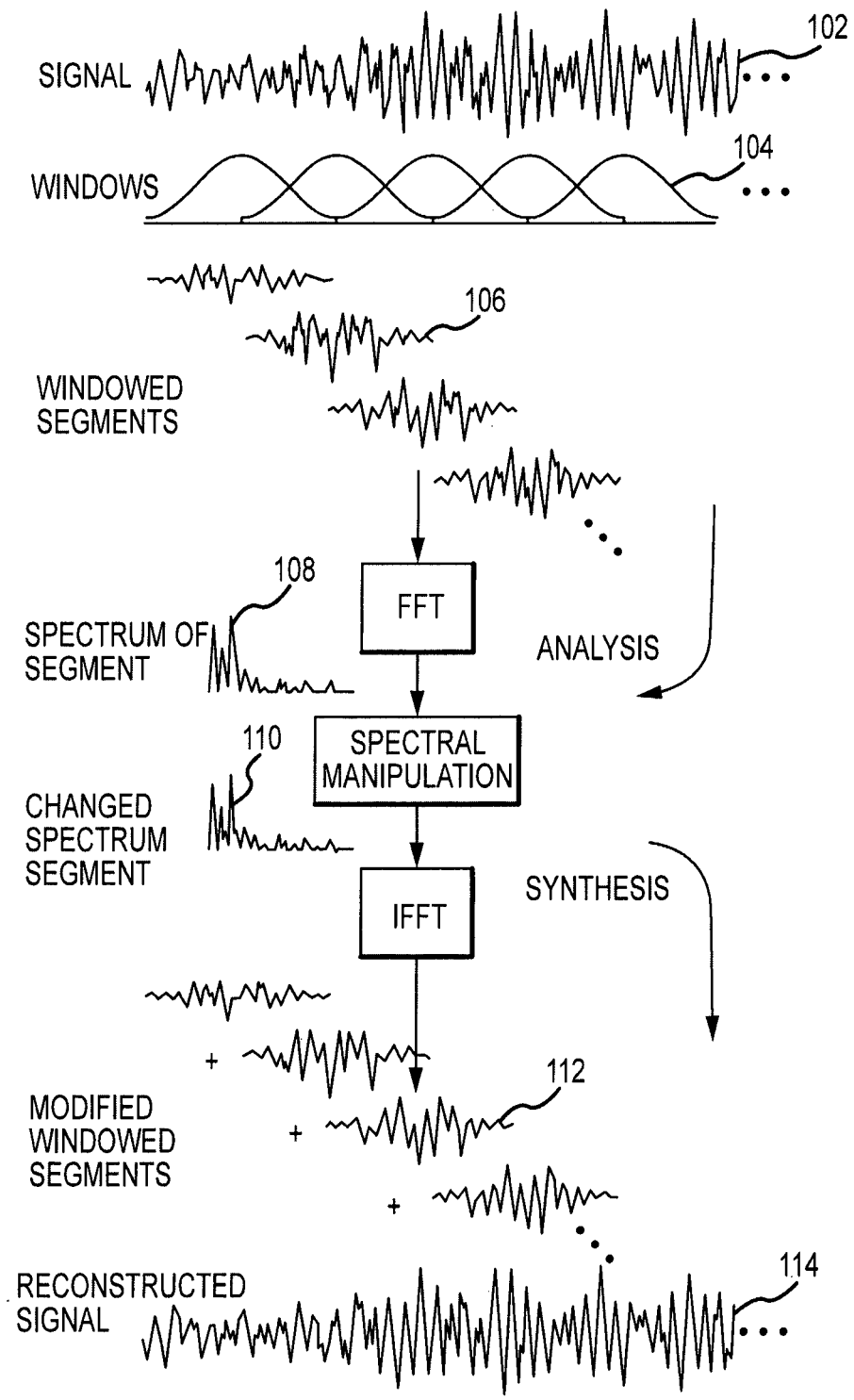
FIG. 1 illustrates a conventional Short-Time Fourier Transform (STFT) procedure for analyzing and reconstructing a signal.

The present disclosure may be understood by reference to the following detailed description, taken in conjunction with the drawings as described below. It is noted that, for purposes of illustrative clarity, certain elements in various drawings may not be drawn to scale.

The present disclosure provides a digital signal processing method for a reduced Heisenberg uncertainty transform, which introduces an intra-frame time dimension into the output of frequency transforms, thereby effectively creating a matrix of frequency transforms for each of the time domain measurements. In frequency analysis of electromagnetic signals, a multitude of time domain measurements undergoing simultaneous frequency analysis is referred to as a "transform frame." An input signal may include N time domain measurements per transform frame, where N is the transform size. Specifically, the intra-frame time dimension is added to the output of a single Fast Fourier transform (FFT) or any other frequency transform, either in unison or as part of a Short-Time Fourier Transform (STFT) sequence of transform frames, which will be discussed with respect to FIG. 1 below.

The Heisenberg uncertainty principle governs the time resolution and frequency resolution of the conventional frequency transform. The effects of the uncertainty principle on resolution may be mitigated by using cross-frequency phase coupling (CFPC) over a highly redundant frequency domain representation. The CFPC may use a signal invariant, a local time-frequency localization parameter λ or an adaptive λ that varies with properties of the signal, and/or time and frequency location. By applying post-processing of the frequency transform of the input signal, intra-frame structural information that is hidden in the conventional frequency transforms may be revealed. The present method uses same-location CFPC to introduce synchronization between different frequency regions. Specifically, by explicitly creating an array of complex-valued sinusoids corresponding to the frequencies, phases, and magnitudes of the frequency transform for all sampled time instants t inside a transform frame and applying CFPC between adjacent frequencies, the present method can work around the uncertainty principle, and provide an estimate of instantaneous magnitudes and phases for all time instants t within a transform frame.

The present method provides a computational extension on the output of a frequency transform to create a time-frequency transform matrix by adding a time dimension. The transform coefficients of the matrix may include real and imaginary parts of a complex exponential or sinusoid at each frequency, or other suitable basis functions within the analyzed transform frame.

The present method provides intra-frame time resolution, which is controlled independently of the frequency resolution. The frequency resolution is dependent on the size of the transform, while the localization in time or time resolution does not depend on the size of the transform. Instead, the time resolution depends on a smoothing factor or local time-frequency localization parameter λ, which may be either chosen manually, or adaptively determined based on local criteria or signal properties.

The present method removes the need for and effects of an apodization ("windowing") function that is commonly used to minimize spectral leakage in the STFT method described below. FIG. 1 illustrates a conventional STFT procedure for analyzing and reconstructing a digitized time domain electromagnetic signal. A sequence of FFTs, often called a Short-Time Fourier Transform or STFT, is commonly used to split a signal into overlapping chunks of time domain data and transform each chunk consecutively. As shown, by using overlapping windows 104, an input signal 102 in a time domain is commonly split into original windowed segments 106 that partially overlap with the neighboring windowed segments. The windowed segments 106 are often called "transform frames." STFT often overlaps the windows at least half of the window width. The STFT requires large overlap in order to retain all of the components in the signal.

Each transform frame includes a multitude of time domain measurements. Then, an FFT is applied to each transform frame 106 to generate a frequency spectrum segment 108, which may then be used for spectral manipulation to generate modified spectrum segments 110. For example, the frequency spectrum segment 108 can be changed to modified spectrum segments, such that a portion of the input signal can be suppressed, enhanced, changed or new components be generated. Each frequency spectrum segment 108 provides a "freeze-frame," i.e., an averaged spectral view of the windowed segment 106. After the spectral manipulation, each modified spectrum segment 110 is inversely transformed into modified window segments 112, which may be modified from the original windowed segments 106. A reconstructed signal 114 may be obtained by adding the modified windowed segments 112.

The uncertainty principle remains in effect for each of windowed segments 106, such that high time resolution and high frequency resolution cannot be simultaneously obtained. Many configurations of the STFT have been developed to trade off one resolution, either time resolution or frequency resolution, against resolution in the other domain. For example, the STFT may adapt the size of the transform to the signal. The STFT may also split the signal into different frequency bands and use a different transform size for each band. The STFT may further modulate the signal to provide alternative representation of the signal content. The STFT may also average the output from adjacent transforms in time or frequency. However, all of these implementations do not reduce the effects of the uncertainty principle, but instead work around the uncertainty principle by improving the resolution in one domain (e.g., time or frequency) while sacrificing the resolution in the other domain. The traditional frequency transform cannot distinguish time-localized features within a transform frame.

The STFT approach spreads temporal changes in the signal across several adjacent transform frames, and due to the loss in localization in the time domain causes manipulation in the frequency domain to be applied to all time domain measurements inside the segment 106/112. For this reason, manipulation of a STFT spectral representation may result in modifying more than a single time domain measurement upon reconstruction, such that the STFT cannot achieve sample-accurate spectrum editing.

Figure 2:
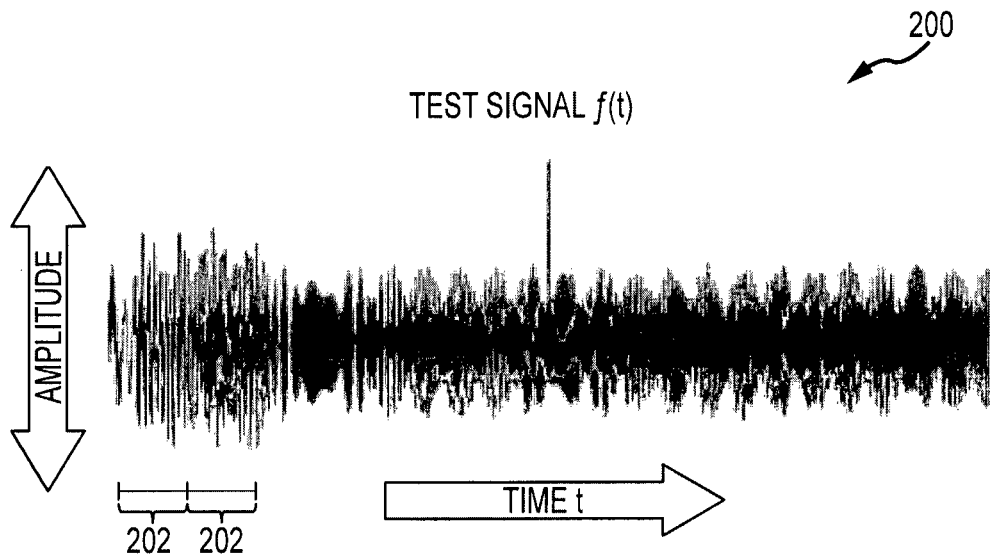
FIG. 2 illustrates an input signal in accordance with embodiments of the present disclosure.
Figure 4A:
FIG. 4A illustrates a first time component or spectral content of the input signal of FIG. 2.
Figure 4B:
FIG. 4B illustrates a second time component or spectral content of the input signal of FIG. 2.
Figure 4C:
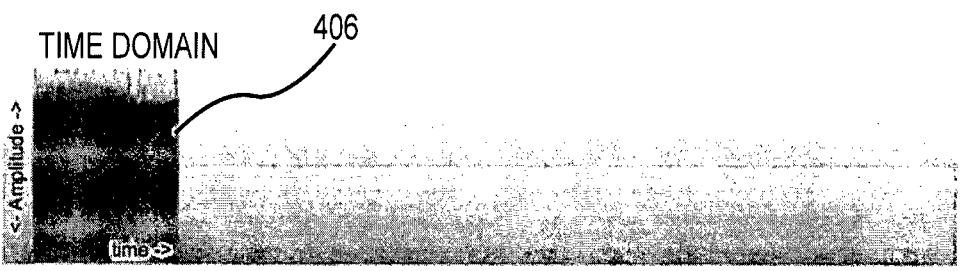
FIG. 4C illustrates a third time component or spectral content of the input signal of FIG. 2.
Figure 4D:
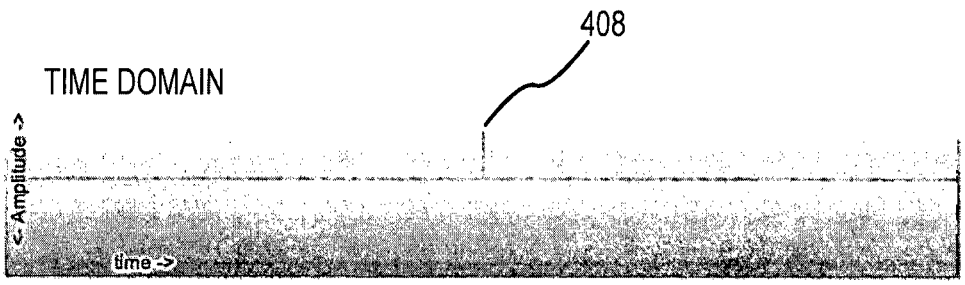
FIG. 4D illustrates a fourth time component or spectral content of the input signal of FIG. 2.

Other existing methods use the Wavelet or Wavelet Packet Transform, Maximum Entropy Method, Lapped Orthogonal Transforms, Gabor Transform, or quadratic time-frequency distributions such as the Wigner-Ville Distribution and related methods for time-frequency analysis. However, these methods introduce varying degrees of artifacts, such as negative energy, aliasing and cross-term distortion, into the measured signal. They may be costly to calculate, and may not easily allow for a physically meaningful representation that supports direct modification (such as magnitude, frequency and phase). Also, it may be difficult to reverse them to yield a modified time domain signal upon modification of the analyzed content and they may not allow the same resolution in the time domain as the present method. In addition, the notion of "frequency" inherently implies sinusoids, so they are not strictly representing the signal in the frequency domain, which makes manual manipulation by an user counter-intuitive FIG. 2 illustrates an input signal in accordance with embodiments of the present disclosure. Specifically, an input signal 200 is measured in amplitude over time. The input signal 200 shows amplitude in time domain. The input signal 200 is a known test signal in this example, in order to illustrate how the present method works. The input signal 200 may include first, second, third, and fourth time components or spectral contents 402, 404, 406, and 408 as shown in FIGS. 4A-4D, respectively. In the time domain, the contributions of 402, 404, 406, and 408 are difficult to distinguish. As shown in FIG. 4A, the first time component 402 includes two closely spaced constant frequency and constant amplitude sinusoids. For the purposes of this example, "aberrant," "irregular," "transient," or otherwise "unwanted" signals or signal features are superimposed over the constant amplitude sinusoid signals. Such aberrant signals can be indicative of undesirable noise or transient anomalies affecting the clarity and quality of the signal of interest. Alternatively, the unwanted signals could merely be a part of a recorded signal that one desires to remove. For example, in the context of a music recording, it may be desirable to remove the sound created by a particular instrument in an ensemble of instrument sounds for mere aesthetic purposes. As shown in FIG. 4B, the second time component 404 includes a linearly swept sinusoid (chirp), which increases in frequency over time. The third time component 406 includes a short time, frequency-modulated sinusoid as shown in FIG. 4C. The fourth time component 408 includes a single time domain impulse, which is a spike, as shown in FIG. 4D. If the signal is an audio signal, the spike may have a click sound, such as the sound introduced by a scratched record.

The present method does not require multiple transform frames like the STFT method, as it does not provide a "freeze frame" view of the spectrum. Instead, the present method provides a spectrum as a function of time for each transform frame. In some embodiments, to accelerate processing speed, the input signal 200 may be split into a number of transform frames 202, for example, each transform frame being a number N time domain samples long. In one example embodiment, N may be 4096 time domain samples long. These transform frames 202 may have small overlap so that there is no discontinuity at the boundary between two adjacent transform frames. In some embodiments, the overlap is less than 10%. In some embodiments, the overlap is less than 5%. In some embodiments, the overlap is less than 1%.

The input signal 200 may be converted into a frequency domain signal, which is expressed in magnitudes and phases on a grid of frequency bins (frequency samples). The frequency transform expresses the signal in terms of a sum of sinusoids at various frequencies over a given measurement time interval. The magnitudes and phases of the frequency transform can be measured or estimated to determine the appropriate mixture that represents the signal in the frequency domain. Since sinusoids are periodic and only include single frequencies, the sinusoids distribute structural information pertaining to the evolution of the signal in time across the entire analysis interval, which makes it impossible to pinpoint the precise onset of changes in the signal after the frequency transform has occurred.

Figure 3:
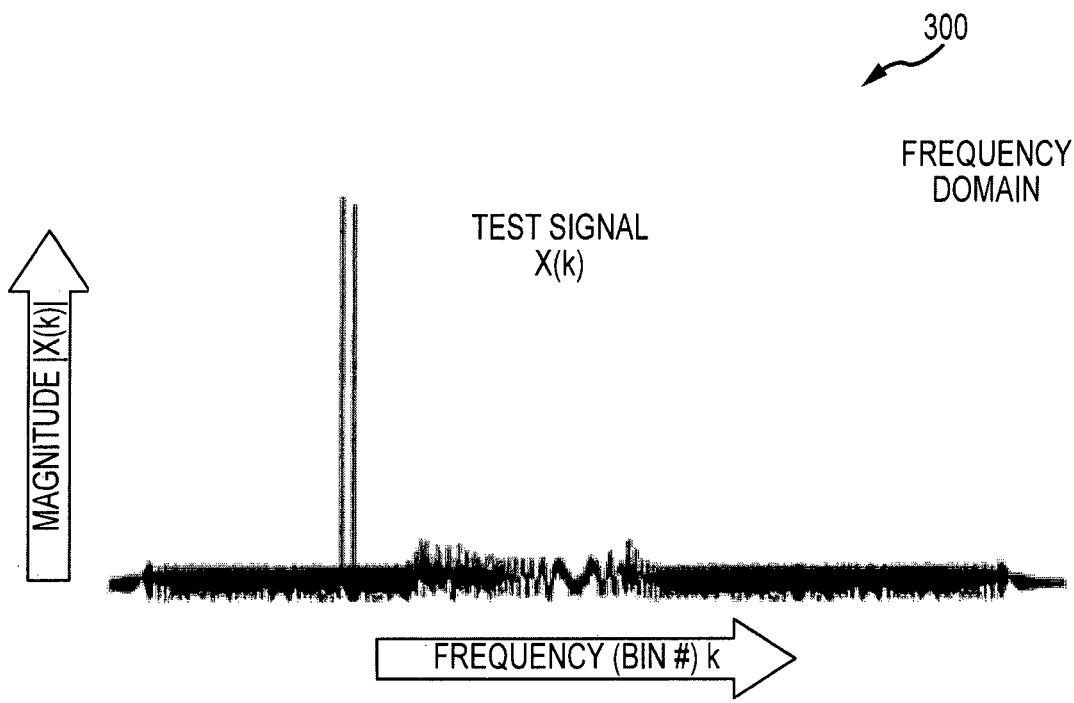
FIG. 3 illustrates a frequency transform of the input signal of FIG. 2 in as represented by its FFT magnitudes.
Figure 5B:
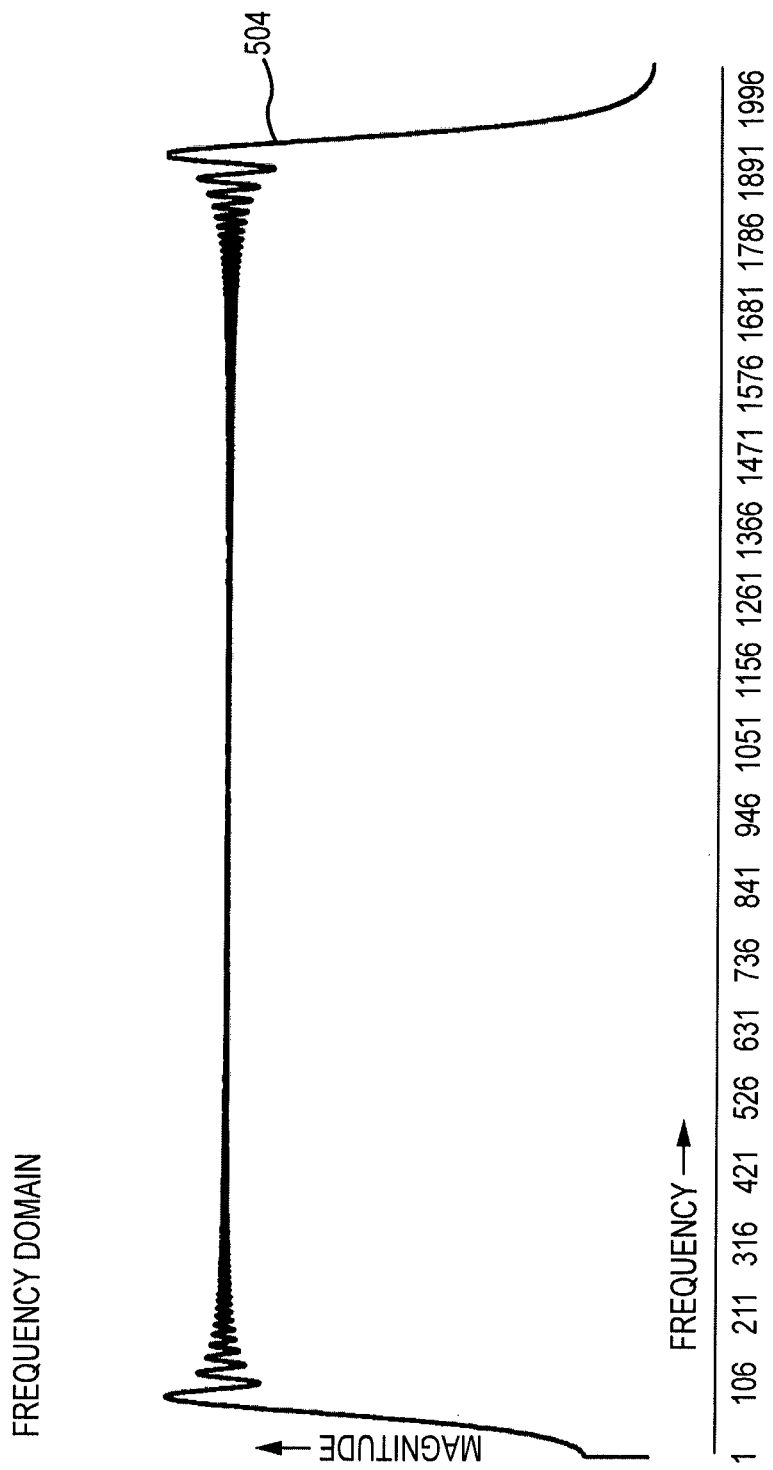
FIG. 5B illustrates the magnitudes of the frequency transform of the second time component of the input signal of FIG. 2.

FIG. 3 illustrates a frequency transform of the input signal of FIG. 2 as represented by its FFT magnitudes. As shown, frequency transform 300 is shown in the amplitude versus frequency bin k. The frequency transform 300 may include four frequency components 502, 504, 506, and 508 as shown in FIGS. 5A-5D corresponding to the four time components 402, 404, 406, and 408 of FIGS. 4A-4D, respectively. As shown in FIG. 5A, a first frequency component 502 has two narrow frequency peaks corresponding to the two sinusoids in the first time component 402. Also, a second frequency component 504 has a wide frequency band corresponding to the second time component 404 or chirp (see FIG. 5B). The transform magnitude is nearly constant across all frequencies. Additionally, a third frequency component 506 corresponding to the third time component 406 includes a signal of varying magnitudes and varying frequencies within a frequency band or range.

A fourth frequency component 508 corresponding to the fourth time component 408 has a constant magnitude across all frequency bins. It has a maximum localization in the time domain (a single measurement) and therefore has no localization in the frequency domain as dictated by the uncertainty principle.

In one embodiment, when time domain samples are unevenly spaced, a fast Lomb-Scargle Periodogram algorithm may be used for frequency transform. The Lomb-Scargle Periodogram algorithm provides spectral analysis with less spectral leakage than the FFT, and is typically implemented by least-squares fitting a set of sinusoids of different frequencies to a given signal by a combination of Lagrange interpolation and FFT. When time domain samples are evenly spaced and speed is important, the FFT may be used. It will be appreciated by those skilled in the art that other frequency transforms may also be used instead of the FFT.

Frequency to Time-Frequency Matrix Extension

Figure 6:
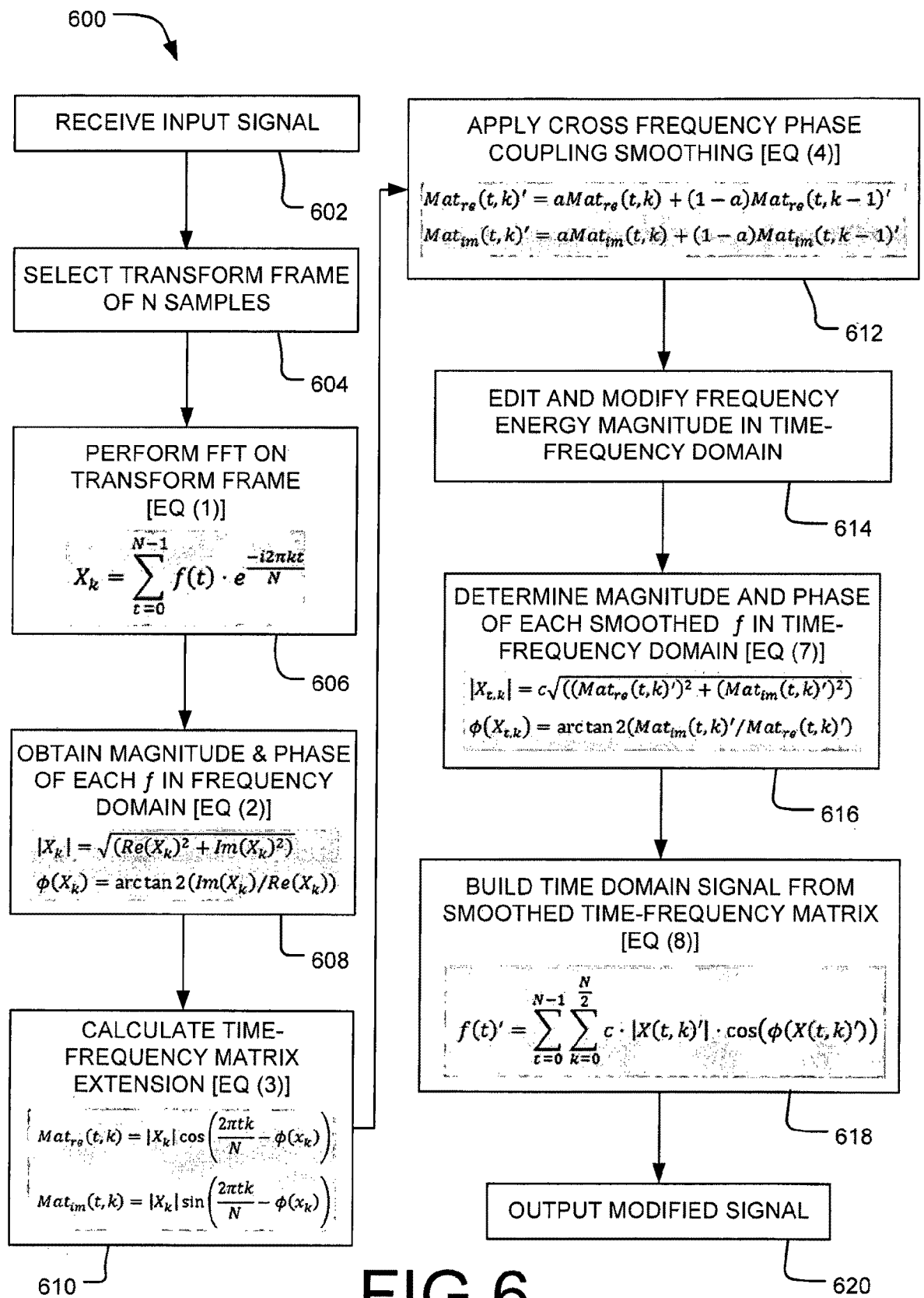
FIG. 6 is a flow diagram detailing an exemplary process for transforming a signal from the time domain to the time-frequency domain for spectral editing in accordance with embodiments of the present disclosure.

One exemplary signal processing method 600 utilizing a time-frequency matrix extension and smoothing, e.g., via CFPC, to modify an input signal and remove unwanted characteristics is described below with respect to FIG. 6.

The present signal processing method 600 uses a frequency to time-frequency matrix extension. An input signal is first received within the processing system. (Step 602.) For simplicity in the following description, an input signal may be assumed as a real-valued time domain signal f(t), which may be transformed into frequency spectra by an FFT. A transform frame of N samples in length is then selected from the input signal. (Step 604.) A discrete Fourier transform output $X_k$ is obtained from time domain signal f(t), as shown in Equation (1), where t stands for time instant, N stands for the size of the transform, and k stands for frequency bin or number, and $0 \le t < N$, $$X_k = \sum_{t=0}^{N-1} f(t) \cdot e^{\frac{-i 2\pi k t}{N}}  \quad \text{Equation (1)}$$

where f(t) denotes an input signal, and $X_k$ denotes the Fourier transform at frequency number k. $X_k$ may be a complex valued signal, including a real portion $Re(X_k)$ and an imaginary portion $Im(X_k)$. (Step 606.) Fourier transform magnitude $|X_k|$ and phase $\phi(X_k)$ are obtained by Equation (2):

$$|X_k| = \sqrt{(Re(X_k)^2 + Im(X_k)^2)}$$

$$\phi(X_k) = \arctan 2(Im(X_k)/Re(X_k))  \quad \text{Equation (2)}$$

where arctan 2 is a quadrant-preserving arctangent function that computes the arctangent of the quotient $(Im(X_k)/Re(X_k))$. (Step 608.)

Figure 7:
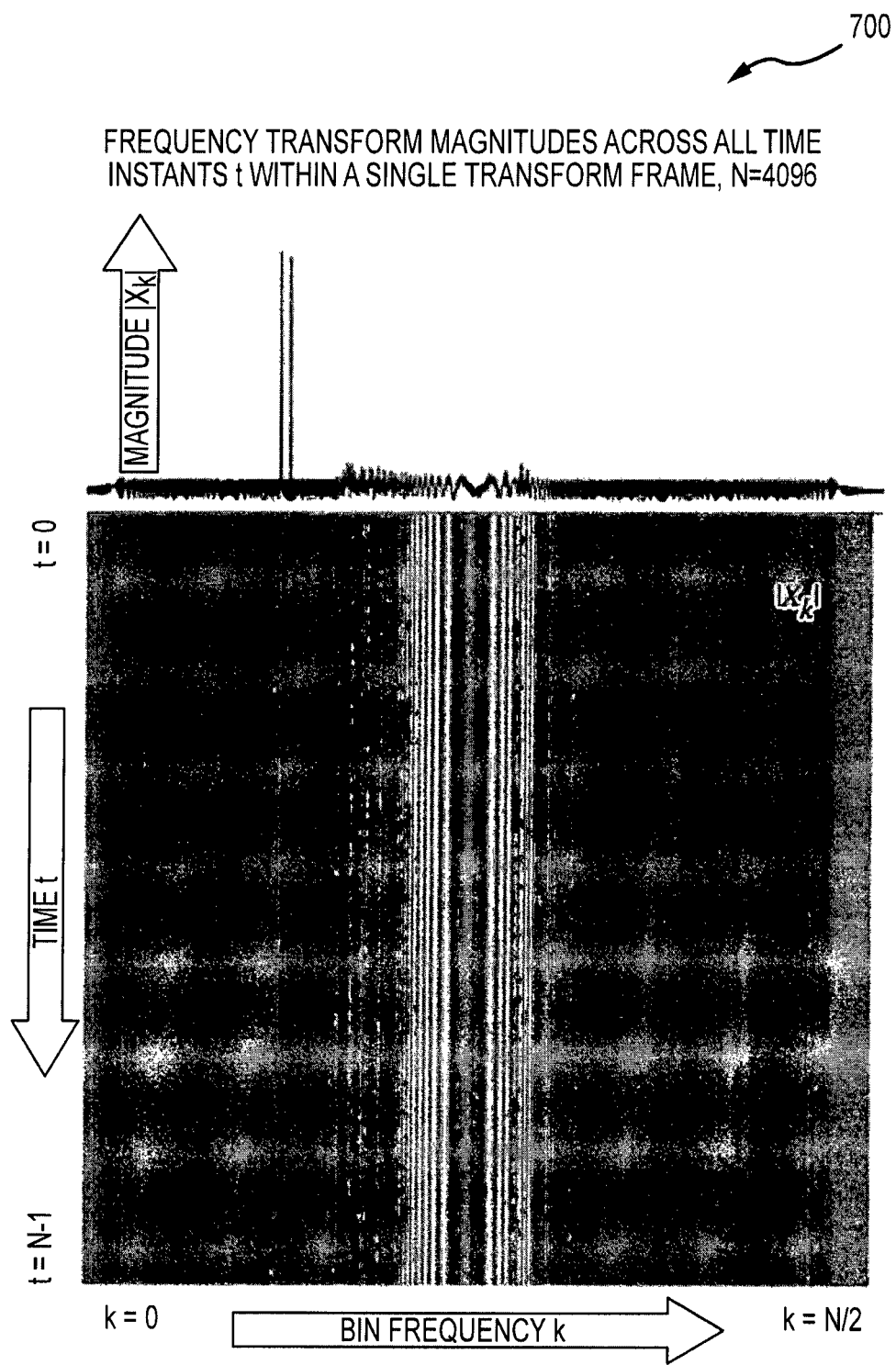
FIG. 7 illustrates a conventional frequency transform with magnitudes extended for all time instants within a single transform frame.

FIG. 7 illustrates conventional frequency transform with magnitudes extended for all time instants within a single transform frame, which may be a windowed segment 106 as shown in FIG. 1. Regular frequency transform magnitudes 700 show frequency transform magnitudes $|X_k|$ in Equation (2) across a number N of time instants or slots or samples of duration t within the single transform frame. The magnitudes are constant for each frequency bin k along a horizontal axis and are independent of time instants t along a vertical axis. As shown in FIG. 7, the conventional frequency transform results in a time-invariant line spectrum proportional to the magnitudes $|X_k|$ of the frequency transform across all time instants t.

The resulting transform magnitude $|X_k|$ and phase $\phi(X_k)$ may be used directly as inputs for Equation (3), which represents the frequency to time-frequency matrix extension. Expanded time-frequency matrices, including real matrix $Mat_{re}(t, k)$ and imaginary matrix $Mat_{re}(t, k)$, contain sine and cosine waves. The matrices create individual partial periodic waves for all time instants or slots t. The expanded time-frequency matrices are across all time instants t and frequency numbers or bins k and may be expressed in Equation (3) as shown below:

$$Mat_{re}(t, k) = |X_k| \cos\left(\frac{2\pi t k}{N} - \phi(x_k)\right)$$
$$Mat_{im}(t, k) = |X_k| \sin\left(\frac{2\pi t k}{N} - \phi(x_k)\right) \quad \text{Equation (3)}$$

where N is typically an even number, in the form $2^m$ (with typical sizes m=10, 11, 12, 13 used in audio processing). (Step 610.) Time domain samples t are equal to 0 . . . N−1. Frequency bin k has a maximum number of N/2+1. Frequency bins may be spaced at frequencies given by k*SampleRate/N in Hz with the lowest frequency bin centered at 0 Hz (DC) and the highest frequency bin at Nyquist (i.e., SampleRate/2 in Hz).

Each of the matrices has N*(N/2+1) transform coefficients, with a first dimension (e.g., rows) of the matrix indicating time t of size N, and a second dimension (e.g., columns) of the matrix representing frequency bin number k of size N/2+1. In one embodiment, both $Mat_{re}(t, k)$ and $Mat_{im}(t, k)$ matrices in Equation (3) use Fourier magnitudes $|X_k|$ and phase values $\phi(X_k)$ from the transform output shown in Equation (2). Each of the two matrices $Mat_{re}(t, k)$ and $Mat_{im}(t, k)$ includes N time slots containing N/2+1 frequency bins corresponding to each of the constituent complex sinusoidal waves in the input signal f(t). Each row t in a matrix contains a sinusoid that has been adjusted for bin phase $\phi(X_k)$ and bin magnitude $|X_k|$ according to the output of the frequency transform for bin k.

In some embodiments, $Mat_{im}(t, k)$ may be left out of the calculations and its contribution may be derived from $Mat_{re}(t, k)$ through redundancy by taking a 90° phase offset.

In some embodiments, the calculation of the matrices may be implicit. For example, the matrices may not be calculated, thus conserving memory. The required computations may be contained in a subsequent stage of the transform.

In some embodiments, specifically when using the FFT, phases and magnitudes may not be explicitly calculated, but may be inferred from a real and imaginary transform coefficient for each frequency number k directly.

It will be appreciated by those skilled in the art that magnitude and phase are used for illustrative purposes only. Many frequency transforms, such as Hartley transform, do not readily provide a real part and an imaginary part.

It will be appreciated by those skilled in the art that other frequency transforms may be used instead of the FFT. The input signal may also be a complex-valued signal, such as in RADAR signal processing, and both negative and positive transform frequencies may be used.

Applying Cross-Frequency Phase Coupling

The present method also includes applying CFPC following the completion of frequency to the time-frequency matrix extension of Equation (3). (Step 612.) The CFPC provides leakage (e.g., energy leakage) into neighboring frequency regions. By achieving leakage between neighboring frequency bands, a certain amount of the energy from neighboring frequency waves are added to a current frequency. In other words, a small amount of neighboring magnitudes and phases may be influencing the magnitude and phase in the current band. Specifically, CFPC introduces synchronization between partial waves of adjacent frequency bands, since the energy of the waves leaks into adjacent frequencies. The peaks that are close to each other in neighboring bands may add up during synchronization, while the peaks that are next to a trough may cancel out.

The leaking of constituent waves in neighboring bins cause energy to add up or cancel out, in effect creating a synchronization process between adjacent matrix columns which affects neighboring peaks. This causes amplifications and cancellations to occur locally such that events occurring synchronously across several frequencies are revealed. This synchronization effect modifies the sinusoids locally to encompass more than a single frequency thereby escaping the uncertainty principle, revealing structural information that is commonly inaccessible in the conventional frequency transform.

CFPC may be achieved by applying a smoothing filter or a moving average filter across waves in neighboring frequency bins, such as an exponential moving average filter, or other moving average filters. The smoothing filter may be a low-pass filter, which passes signals with a frequency lower than a certain cutoff frequency and attenuates signals with frequencies higher than the cutoff frequency. In signal processing, smoothing or integration may have the effect of a low pass filtering operation, while sharpening or differentiation may have the effect of a high pass filtering operation.

Low-pass filters may exist in many different forms, including electronic circuits (such as a hiss filter used in audio), anti-aliasing filters for conditioning signals before analog-to-digital conversion, digital filters for smoothing sets of data, blurring of images, and so on. Low-pass filters provide a smoother form of a signal, removing the short-term fluctuations, and leaving the longer-term trend.

In a particular embodiment, the smoothing filter may be an exponential moving average filter. For example, for each time instant t=0 ... N−1, all bins k=0 ... N/2 and matrices $Mat_{re}(t; k)$ and $Mat_{im}(t, k)$ may be iterated by applying the exponential moving average filter as shown in Equation (4) below:

$$Mat_{re}(t,k)'=aMat_{re}(t,k)+(1-a)Mat_{re}(t,k-1)'$$

$$Mat_{im}(t,k)'=aMat_{im}(t,k)+(1-a)Mat_{im}(t,k-1)' \quad \text{Equation (4)}$$

where $Mat_{re}(t, k)'$ and $Mat_{im}(t, k)'$ denote the resulting smoothed matrix values at time slot t, frequency bin k which is generated after low pass filtering or smoothing. In this embodiment, the smoothing factor a may be calculated from the time-frequency localization parameter λ as described in Equation (5).

$$a = e^{log(\lambda 0.0625)} \left(\frac{8192}{N}\right); 0 \leq \lambda < 1 \quad \text{Equation (5)}$$

In some embodiments, the local time-frequency localization parameter λ value may vary in proportion to a 1/frequency curve, such that a better frequency resolution may be obtained for low frequencies and a better time resolution may be obtained for high frequencies.

In some embodiments, the local time-frequency localization parameter λ may be calculated in proportion to a magnitude $|X_k|'$ of a whitened spectrum, such that a high peak-to-local-average ratio in the magnitude may cause local time-frequency localization parameter λ to be low to achieve a high frequency resolution and a low peak-to-local-average ratio may cause local time-frequency localization parameter λ to be high to achieve a high time resolution. The magnitude for the whitened spectrum is the average magnitude when the CFPC is applied to a spectrum of white noise.

If no matrices were created by Equation (3), such as in the STFT method, smoothing may include all previous computations required in Equation (3). To achieve zero-phase response from the filter, one may run in both forward and reverse direction across all frequency bins.

In some embodiments, the exponential moving average filter may be replaced by an arbitrary finite impulse response (FIR) filter, or an arbitrary infinite impulse response (IIR) filter.

In some embodiments, the exponential moving average filter may be replaced by a rank order filter, such as the median, or a smoothing filter such as a Savitzky-Golay (polynomial) smoothing filter.

In some embodiments, the exponential moving average filter may be replaced by an adaptive filter that determines its characteristics at time instant, or slot t, by taking the results from the past t−1 time and frequency bin or slots k into account.

Embodiment with Signal-Invariant λ

In one embodiment, the CFPC may be achieved by low pass filtering or smoothing across neighboring frequency bins for each time slot t. The low pass filtering may enhance areas where peaks in adjacent frequency bins may coincide by summing the energy across all partial waves in adjacent frequency bins. Intense smoothing (e.g., smoothed by more iterations of Equation (4)) may favor events localized in time, while little smoothing or absence of smoothing may be suitable for signals with periodicities. For example, a sharp time domain transient may appear in many time slots t. Smoothing may further enhance this sharp time domain signal. Periodic waves may be concentrated along the same frequency bins k over a period of time. Smoothing by intense low pass filtering may not enhance the periodic waves.

Figure 8:
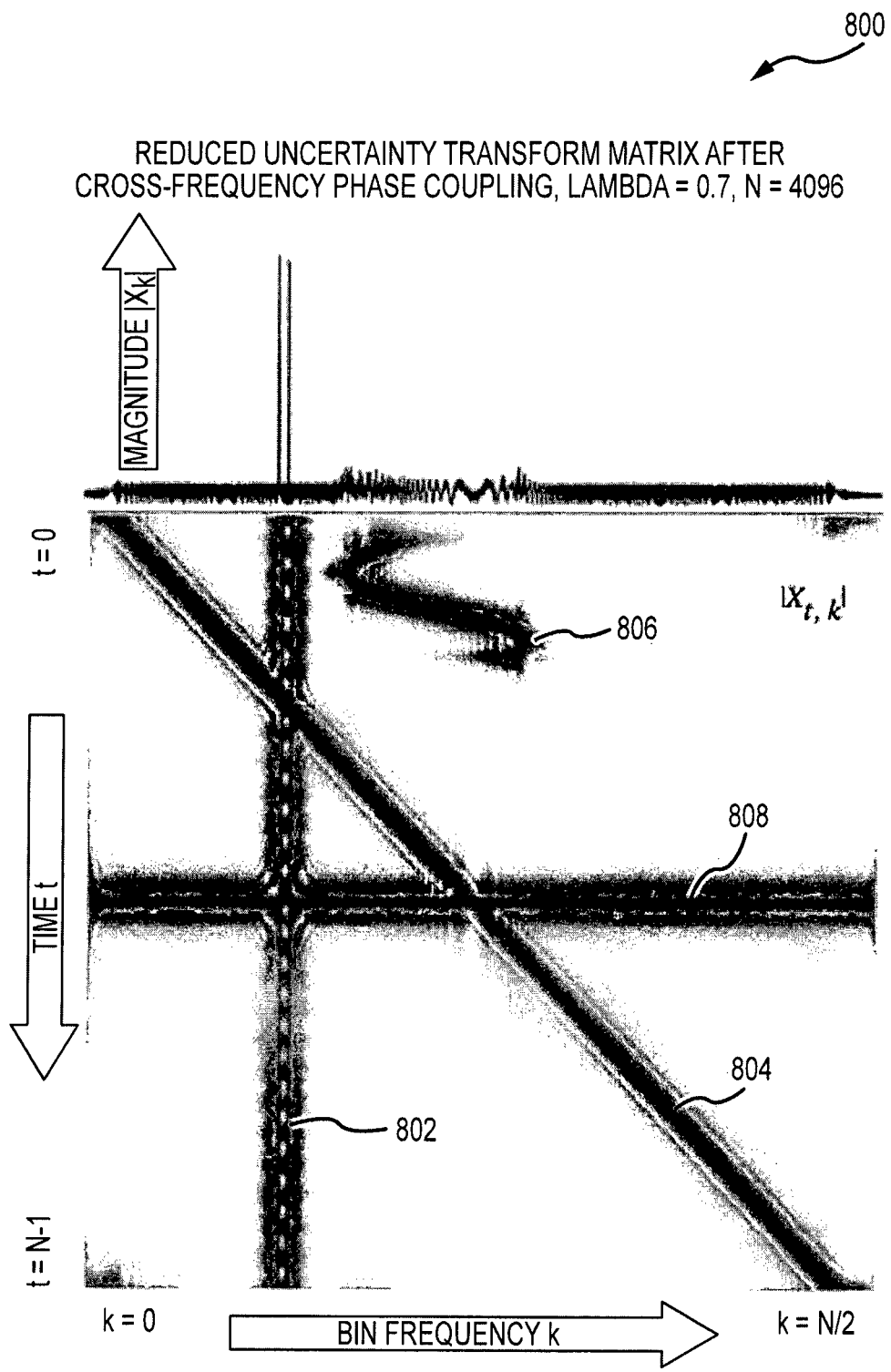
FIG. 8 illustrates the reduced uncertainty transform of the input signal of FIG. 2 with a local time-frequency localization parameter λ equal to 0.7 in accordance with embodiments of the present disclosure.

A user may manually select a local time-frequency localization parameter λ value, and then may adjust the local time-frequency localization parameter λ value between zero and one to achieve the desired output. This manual method may provide flexibility to the user and may also take less time than an adaptive λ method described below. The result of the signal-invariant λ approach may be expressed in magnitudes over frequency and time as depicted in FIG. 8.

Embodiment with Signal-Adaptive λ

In another embodiment, a local time-frequency localization parameter λ value may be automatically created by a signal adaptive λ method, which may simultaneously use different values for the local time-frequency localization parameter λ for calculations, and then may compare the different local time-frequency localization parameter λ values to select a λ based on certain criteria. For example, a computer may include an algorithm that allows a processor in the computer to automatically perform calculations of magnitude $A_\lambda(t,k)$ by using various λ values simultaneously, such as from 0.1 to 0.9 at an increment of 0.1 as an example. The algorithm may compare the resulting magnitudes $A_\lambda(t,k)$ from the various λ values and select the λ value that produces the largest or maximum magnitude. Alternatively, an iterative change of λ may be used that refines an initial guess of λ until it produces an output that maximizes local magnitude at position t, k.

In a particular embodiment, the selected λ value may be used to calculate the smoothing factor a, as shown in Equation (5), and then the two matrices $Mat_{re}(t, k)'$ and $Mat_{im}(t, k)'$ may be obtained from Equation (4). Equation (6) given below shows that magnitude $A_\lambda(t,k)$ may be calculated from the matrices. The algorithm may also assign a selected λ value to the output or smoothed matrices $Mat_{re}(t, k)'$ and $Mat_{im}(t, k)'$ based on the largest signal magnitude or energy:

$$A_\lambda(t,k)=c_\lambda\sqrt{((Mat_{re}(t,k)')^2+((Mat_{im}(t,k)')^2}\qquad\text{Equation (6)}$$

where $c_\lambda$ is a normalization constant that determines the average gain as a function of λ. The normalization constant may be derived heuristically from a test run when the CFPC is applied to a spectrum of white noise in order to normalize the resulting average magnitude. The normalization constant $c_\lambda$ may be empirically obtained in advance and stored for each λ that is to be evaluated.

Figure 9:
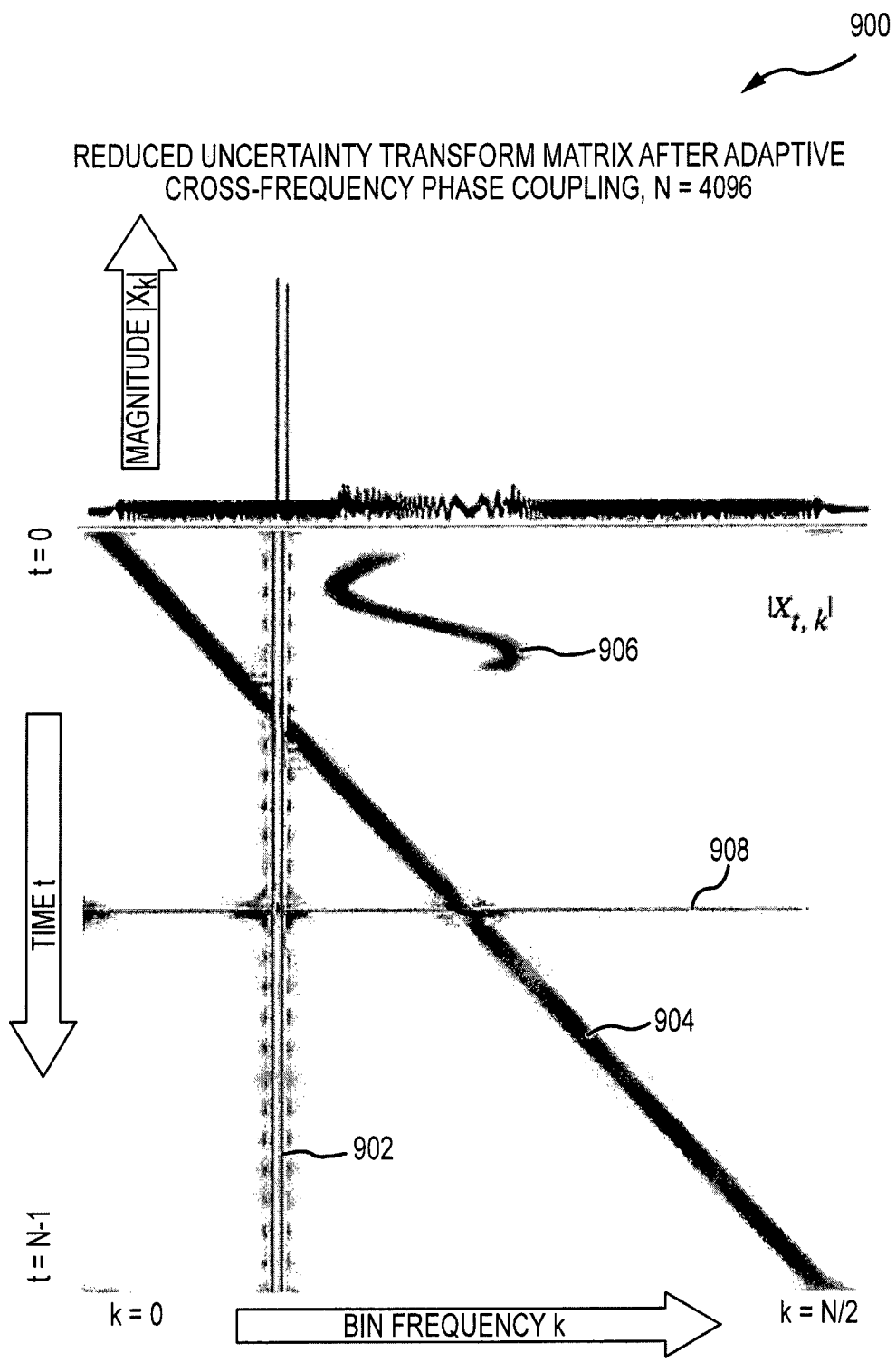
FIG. 9 illustrates the reduced uncertainty transform of the input signal of FIG. 2 with an adaptive local time-frequency localization parameter λ in accordance with embodiments of the present disclosure.

This adaptive λ method automatically determines the best λ value according the criteria, e.g., the largest signal magnitude or energy. This adaptive λ method may take a longer time to process in comparison to manually selecting a λ value. Considering the computer is becoming faster and faster over the years, the signal-adaptive λ approach is now feasible. The result of the signal-adaptive λ approach may be expressed in magnitude over frequency and time as depicted in FIG. 9.

In some embodiments, a matrix may be computed in a three dimensional (3D) space, i.e. time-frequency-λ space. The smoothed matrix may be calculated for a sufficiently dense sampled grid of local time-frequency localization parameter λ values at substantially small increments of λ values. The resulting two-dimensional (2D) time-frequency magnitude slices from. Equation (6) may be stored in another matrix dimension. This 3D matrix may represent the input signal as a varying energy density over space and frequency and can be used to display and manipulate the input signals in 3D space according to their localization in time or frequency.

Signal Modification

Once the signal is represented in the time-frequency domain, it may be easily edited at a resolution of each frequency band as well as over each individual time sample. (Step 614.) Because each frequency in the time domain has a single corresponding spectral line in the time-frequency domain, it is easy to manipulate, modify, suppress, or enhance spectral contents in a time-frequency domain to remove noises or scratches in the original input signal. A user may select parts of the spectrogram representation of the signal and modify them using selection tools as used in image processing, or machine aided selection tools, or through parametric selection methods based on signal criteria.

In some exemplary implementations, a group of frequencies may be extracted by either manually or automatically by defining an arbitrarily shaped boundary around the frequencies, also referred to as "region of support" (ROS). The region outside the ROS may be suppressed or extracted. In some embodiments, when a complex-valued signal representation is available at the output, the average signal within the ROS can be determined using instantaneous frequency estimation as described in Hilbert spectral analysis. Specifically, the present method may be used as a first stage of a Hilbert-Huang Transform in place of computing intrinsic mode functions, and may also be used to compute the Hilbert spectrum as a function of λ instead of using the output of a Singular Value Decomposition process.

Formulation of Output

The method further provides a modified time domain representation of the input signal post editing. The smoothed matrices $Mat_{re}(t, k)'$ and $Mat_{im}(t, k)'$ may be calculated by iterating through all time instants t and all frequency bins k, including edited bins, to formulate the time-varying magnitude and phase response. (Step 616.) Time-frequency magnitudes $|X_{t,k}|$ and phases $\phi(X_{t,k})$ may be calculated from the smoothed matrices by Equation (7) as the following:

$$|X_{t,k}|=c\sqrt{((Mat_{re}(t,k)')^2+Mat_{im}(t,k)')^2)}$$

$$\phi(X_{t,k})=\arctan 2(Mat_{im}(t,k)'/Mat_{re}(t,k)')\qquad\text{Equation (7)}$$

where arctan 2 is a quadrant preserving arctangent function that computes the arctangent of the quotient $(Mat_{im}(t, k)'/Mat_{re}(t, k)')$. Based on the time-frequency magnitudes $|X_{t,k}|$ and phases $\phi(X_{t,k})$ of the edited frequency values obtained from Equation (7), a modified time domain representation $f(t)'$ may be obtained by Equation (8) (an Inverse Discrete Fourier Transform (IDFT)), which is the inverse time-frequency transform for real-valued signals as shown below:

$$f(t)' = \sum_{t=0}^{N-1}\sum_{k=0}^{\frac{N}{2}} c \cdot |X(t, k)'| \cdot \cos(\phi(X(t, k)'))\qquad\text{Equation (8)}$$

where c is a scaling constant that may be required depending on the frequency transform used in order to keep the same gain factor for the signal. (Step 618.) In other words, the modified time domain representation $f(t)'$ has no amplitude gain or loss compared to the input signal $f(t)$.

This modified time domain representation $f(t)'$ may thus be the result of manipulating the spectral contents of the transform along time, frequency, and magnitude axes at the same time. The modified time domain representation may also provide a base for various applications. The modified transform representation may be output for display, for use by another process, or directly used to manipulate the spectral contents in the time domain such as shown in FIG. 2, in the frequency domain such as shown in FIG. 3, or both at the same time by manipulating time-frequency magnitude such as shown in FIG. 8 or FIG. 9. (Step 620.) After displaying or modifying the reduced uncertainty transform representation, the modified output signal is obtained in similar ways as the STFT approach, such as steps 110 and 112 shown in FIG. 1.

FIG. 8 illustrates the reduced uncertainty transform of the input signal of FIG. 2 with a local time-frequency localization parameter λ equal to 0.7 in accordance with embodiments of the present disclosure. The time-frequency transform magnitudes $|X_{t,k}|$ as shown in Equation (7) are shown over frequency bin k and time slot t with N equal to 4096 ($2^{12}$) in FIG. 8. Time-frequency magnitude 800 includes four distinctive components 802, 804, 806, and 808 corresponding to four time components, as shown in FIG. 2. For example, a first spectral content (e.g., vertical line 802) at a constant frequency bin corresponds to the sinusoids 402 shown in FIG. 4A. This is a case in which a local frequency resolution is high.

A second spectral content (e.g., diagonal line \804) linearly extends from a starting point of the lowest time slot of zero and the lowest frequency bin of zero to an end point having the highest time slot of N−1 and frequency bin of N/2. Diagonal line 804 corresponds to the chirp component 404, as shown in FIG. 4B.

A third spectral content (e.g., short time sinusoid wave 806) at the initial time slot corresponds to the short time modulated frequency modulated signal 406 as shown in FIG. 4C. A fourth spectral content (e.g. horizontal line 808) at a constant time slot corresponds to the spike 408 as shown in FIG. 4D. This is a case in which a local time resolution is high.

The frequency to time-frequency matrix extension allows to clearly or distinctively present the four different time components in time-frequency transform magnitude $|X_{t,k}|$, such as given in Equation (7). In contrast, without the frequency to time-frequency matrix extension, the conventional frequency transform magnitude $|X_k|$, such as given in Equation (2), cannot distinguish the four components, as shown in FIG. 7.

As illustrated above, each distinct element of spectral content (e.g., 402, 404, 406, and 408) in the time domain (see FIGS. 4A-4D) has a single corresponding element of spectral content (e.g., 802, 804, 806, and 808) in the time-frequency magnitude domain (see FIG. 8). One of the benefits of this single correspondence between the time domain and the time-frequency magnitude domain is to allow to simultaneously manipulation of the spectral contents in the frequency domain and the time domain by applying changes in the time-frequency magnitude domain.

FIG. 9 illustrates the reduced uncertainty transform of the input signal of FIG. 2 with a signal adaptive local time-frequency localization parameter λ in accordance with embodiments of the present disclosure. In this example, the size of the transform N is equal to 4096. The time-frequency magnitude $|X_{t,k}|$ is calculated from Equation (7). The time-frequency magnitude $|X_{t,k}|$ includes four components 902, 904, 906 and 908, which look similar to component 802, 804, 806, and 808, respectively, but at a better resolution than that shown in FIG. 8. For example, horizontal line 908 shown in FIG. 9 is thinner than horizontal line 808 shown in FIG. 8. Constant sinusoids 902 shown in FIG. 9 appear with less modulation than the constant frequency sinusoids 802 shown in FIG. 9.

Figure 10:
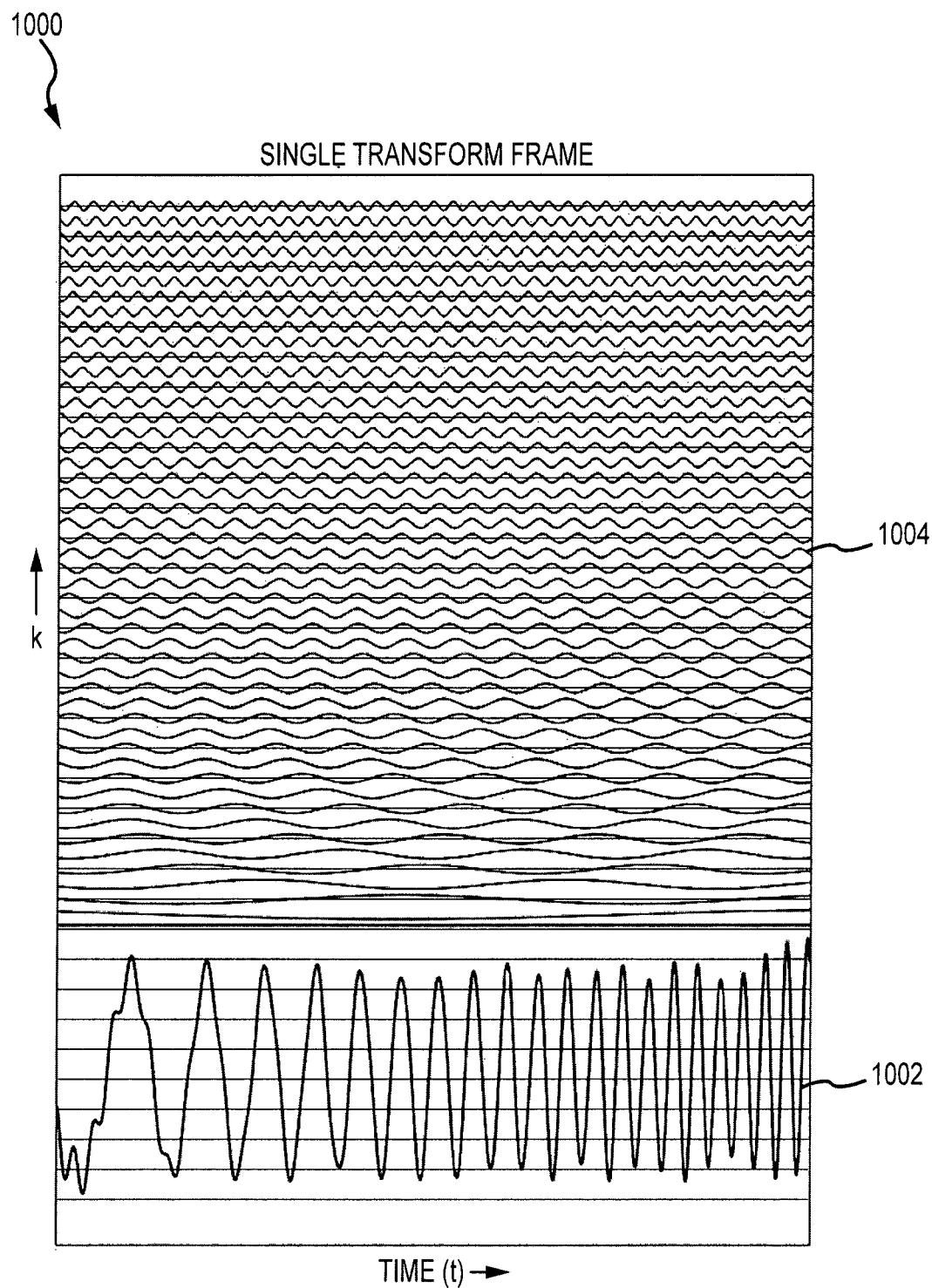
FIG. 10 illustrates the real valued part of a time domain chirp signal after a frequency transform and after frequency to time-frequency matrix extension for a single transform frame in accordance with embodiments of the present disclosure.
Figure 11:
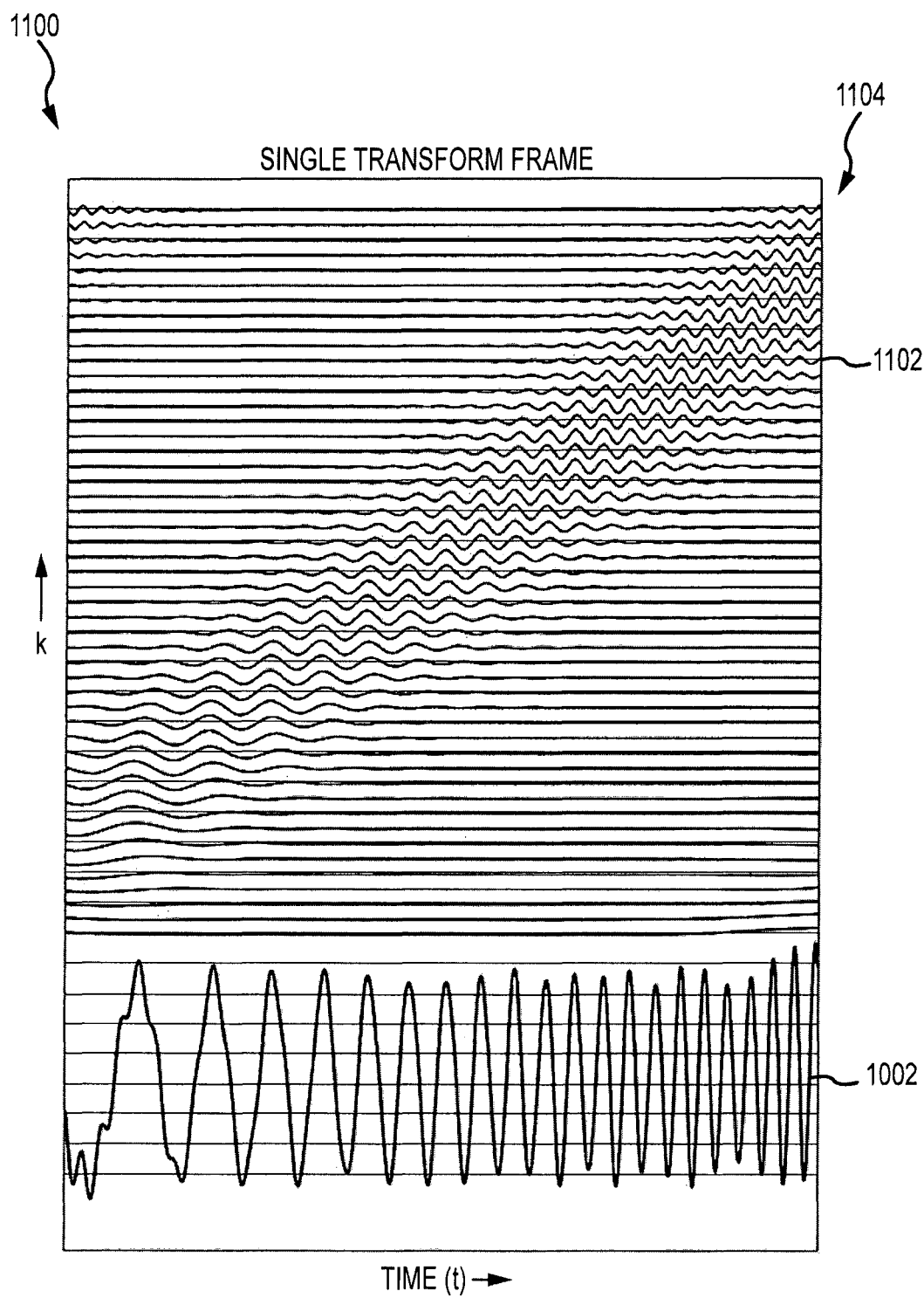
FIG. 11 illustrates the real valued part of a time domain chirp signal after a frequency transform and after frequency to time-frequency matrix extension with exponential smoothing along the frequency bin k axis in accordance with embodiments of the present disclosure.
Figure 12:
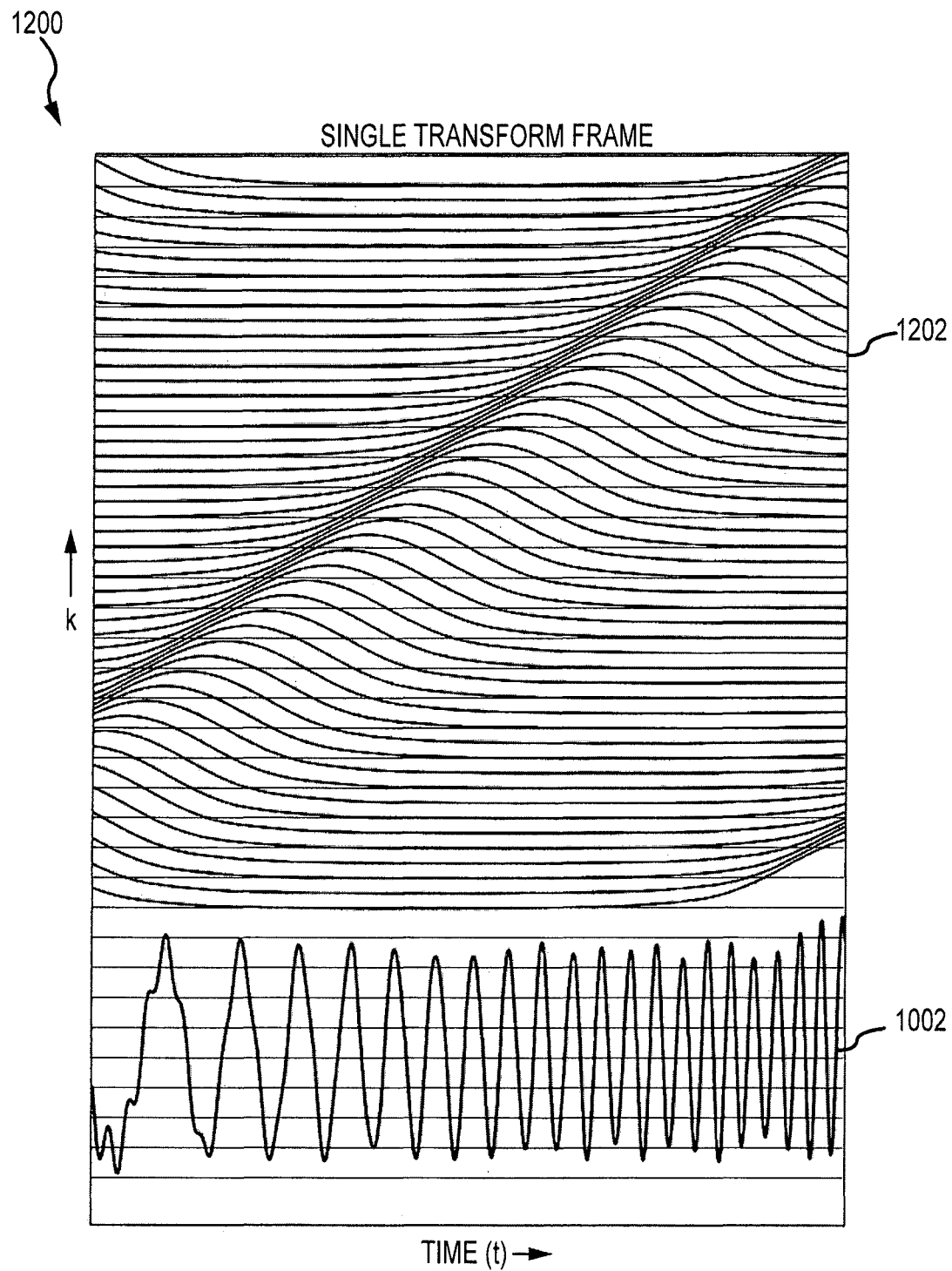
FIG. 12 illustrates the magnitude of FIG. 11 in accordance with embodiments of the present disclosure as obtained from both real and imaginary matrix

FIGS. 10-12 provide schematic representations that illustrate how frequency to time-frequency matrix extension generates partial waves, and how CFPC change the partial waves from periodic sinusoids into non-periodic wave packets for a chirp signal. FIG. 10 illustrates the real valued part of a time domain chirp signal after a frequency transform and after frequency to time-frequency matrix extension for a single transform frame in accordance with embodiments of the present disclosure. As shown, the chirp signal 1002 in the single transform frame is shown at the bottom, while representation 1000 includes individual sinusoids 1004 that are shown above the chirp signal 1002. The individual periodic sinusoids 1004 are obtained from Equation (3) and are constant in frequency and magnitude for each frequency bin over the entire transform frame. Representation 1000 reveals no structural information, which suggests that the traditional transform cannot determine time-localized features within the transform frame: This result is in accordance with the Heisenberg uncertainty principle, which states that, for a periodic wave, localization in frequency and time are properties that can only be determined with reciprocal accuracy.

When smoothing across the vertical axis, i.e., frequency bin k axis, such as exponential smoothing or any other smoothing, the neighboring waves leak into each other, which causes amplifications and cancellations to occur locally. FIG. 11 illustrates the real valued part of a time domain chirp signal after a frequency transform and after frequency to time-frequency matrix extension with exponential smoothing along the frequency bin k axis in accordance with embodiments of the present disclosure. The smoothing changes the periodic sinusoids 1004 of FIG. 10 into more complex, non-periodic wave packets 1102. As shown, smoothed representation 1100 includes visible interference between adjacent waves 1004 in FIG. 10 along a diagonal direction 1104, as a result of exponential smoothing.

FIG. 12 illustrates the magnitude of FIG. 11 in accordance with embodiments of the present disclosure. Smoothed magnitude representation 1200 clearly shows the energy or magnitude 1202 moving through the time-frequency space.

Figure 13:
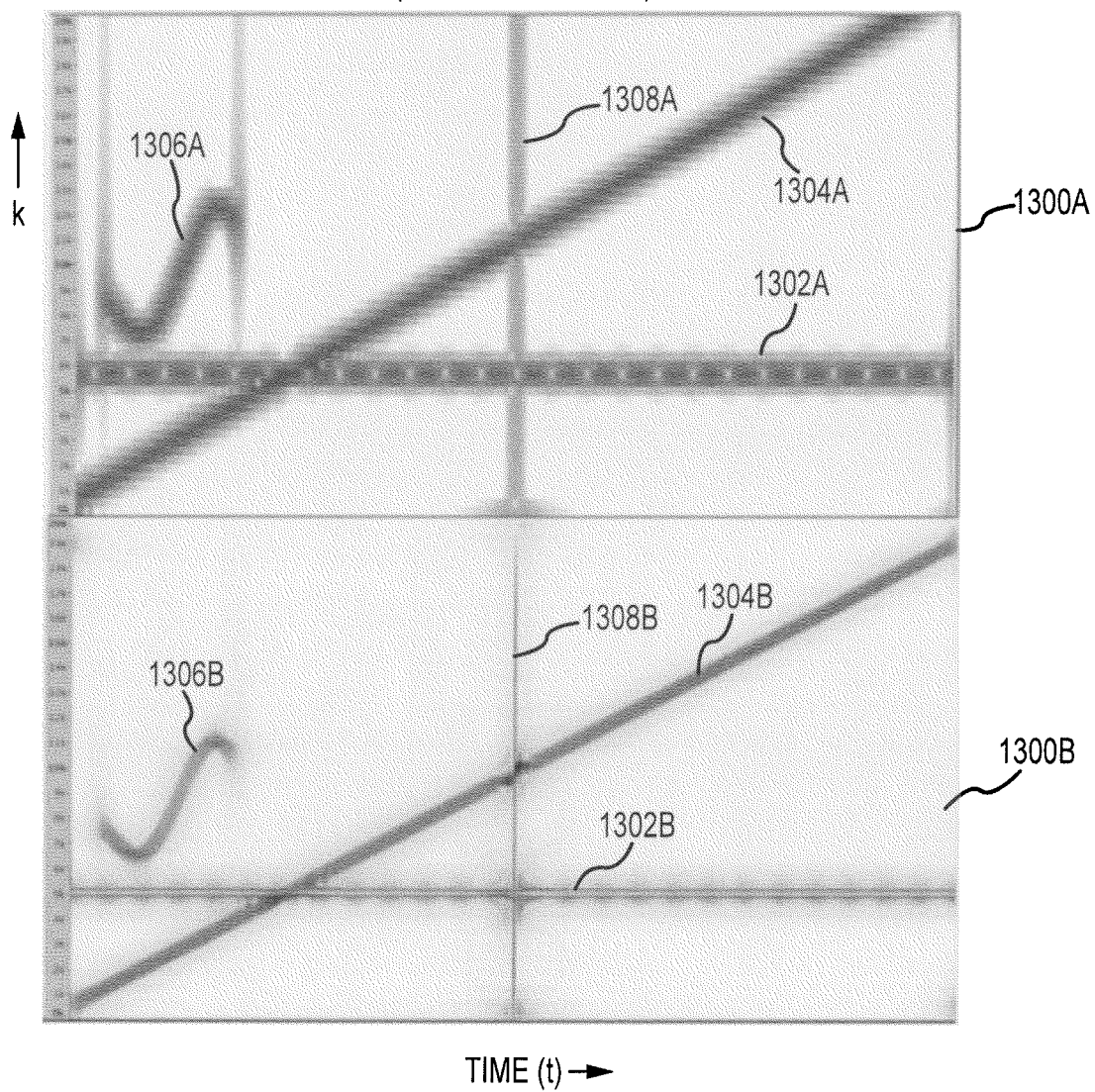
FIG. 13 illustrates a comparison between a visually similar STFT sequence (top), where; N=256 and the resolution per bin is 172.26 Hz at a sample rate (SR) of 44.1 kHz, and an adaptive reduced uncertainty transform (bottom), where N=4096 and the resolution per bin is 10.77 Hz at a SR of 44.1 kHz, in accordance with embodiments of the present disclosure.

FIGS. 13-13 provide the comparison of the present method with the STFT method. FIG. 13 illustrates a comparison between a visually similar STFT sequence (top), where N=256 and the resolution per bin is 172.26 Hz at a sample rate (SR) of 44.1 kHz and an adaptive reduced uncertainty transform (bottom), where N=4096 and the resolution per bin is 10.77 Hz at a SR of 44.1 kHz, in accordance with embodiments of the present disclosure. The STFT representation 1300A shows magnitude $|X_k|$ in a time-frequency domain where the horizontal axis is time while the vertical axis is frequency. Magnitude $|X_k|$ is obtained without matrices in Equation (3), but with low pass filtering as shown in Equations (4) and (5). The STFT representation 1300A requires multiple transform frames for the calculation. The STFT representation 1300A has a frequency resolution of 44.1 kHz/256, which is about 172 Hz for each frequency bin at a sampling rate of 44.1 kHz.

The reduced uncertainty representation 1300B shows magnitude $|X_{t,k}|$ in the time-frequency domain where the horizontal axis is time while the vertical axis is frequency. Magnitude $|X_{t,k}|$ is obtained from Equation (7). The reduced uncertainty representation 1300B has a frequency resolution of 44.1 kHz/4096, which is about 11 Hz for each frequency bin at a sampling rate of 44.1 kHz. The time resolution of component 1308B is much higher than the time resolution of component 1308A, causing 1308B to have smaller width. As shown, the resolutions of the present method are much higher than the STFT method. This example also shows that smoothing without time extension to the frequency transform in the STFT does not provide high frequency resolution and high time resolution simultaneously.

Figure 14:
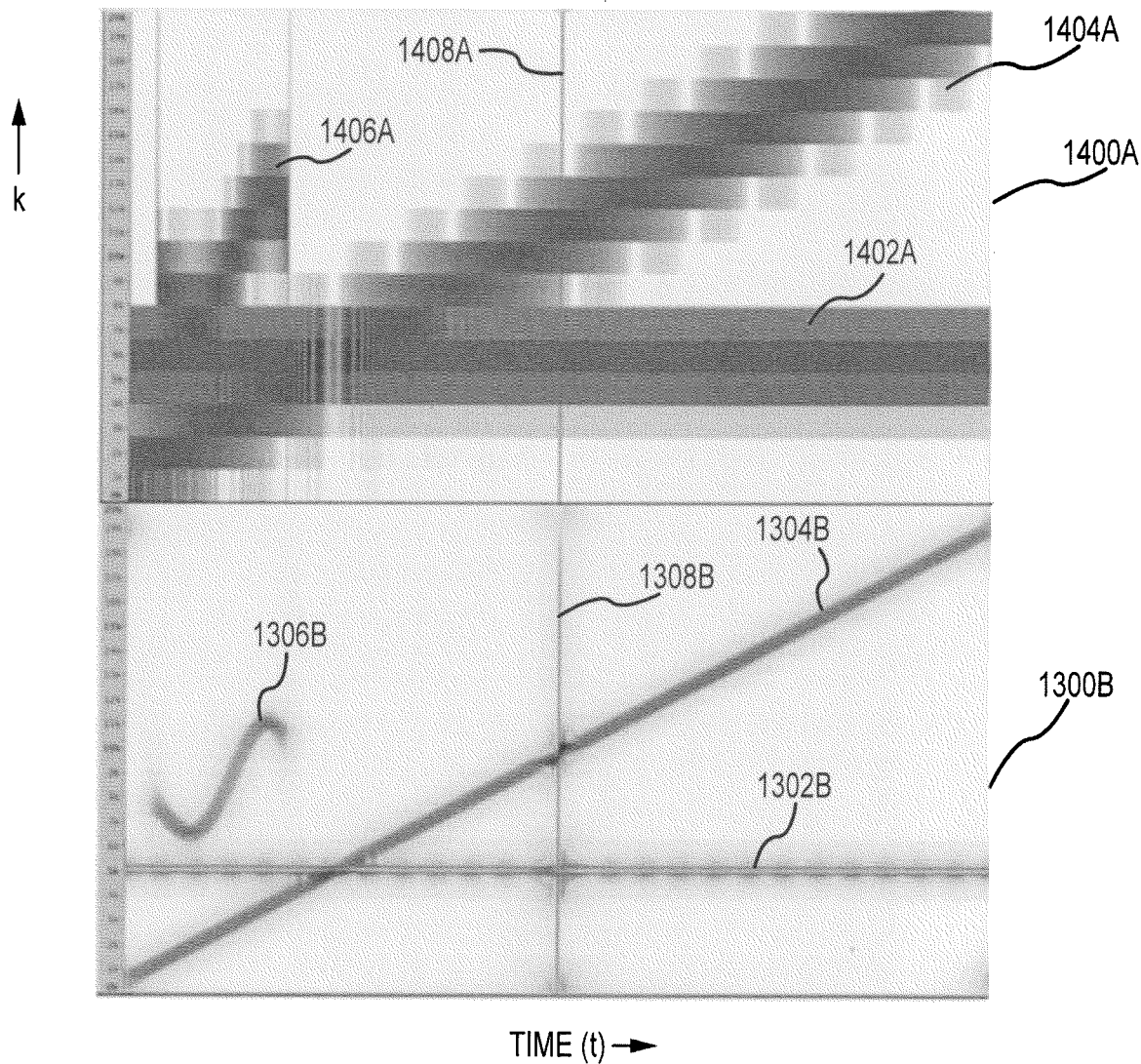
FIG. 14 illustrates a comparison between a high time resolution STFT sequence (top), where N=32 and the resolution per bin is 1378.13 Hz at a SR of 44.1 kHz, and an adaptive reduced uncertainty transform (bottom), where N=4096 and the resolution per bin is 10.77 Hz at a SR of 44.1 kHz, in accordance with embodiments of the present disclosure.

FIG. 14 illustrates a comparison between a high time resolution STFT sequence (top), where N=32 and the resolution per bin is 1378.13 Hz at a SR of 44.1 kHz and an adaptive reduced uncertainty transform (bottom), where N=4096 and the resolution per bin is 10.77 Hz at a SR of 44.1 kHz, in accordance with embodiments of the present disclosure. The STFT representation 1400A shows magnitude $|X_k|$ in a time-frequency domain. The STFT representation 1400A (top) provides a high time resolution, but a poor frequency resolution, e.g., 1378.13 Hz resolution per bin at a SR of 44.1 kHz. Specifically, the STFT representation 1400A includes four components 1402A, 1404A, 1406A, and 1408A. Only the spike 1408A is clear in 1400A, like 1308B shown in adaptive reduced uncertainty transform representation 1300B. The other three components 1402A, 1404A, and 1406A are all sinusoids-based and look vague and unclear, unlike the corresponding components 1302B, 1304B, and 1306B shown in the adaptive reduced uncertainty transform representation 1300B (bottom).

Figure 15:
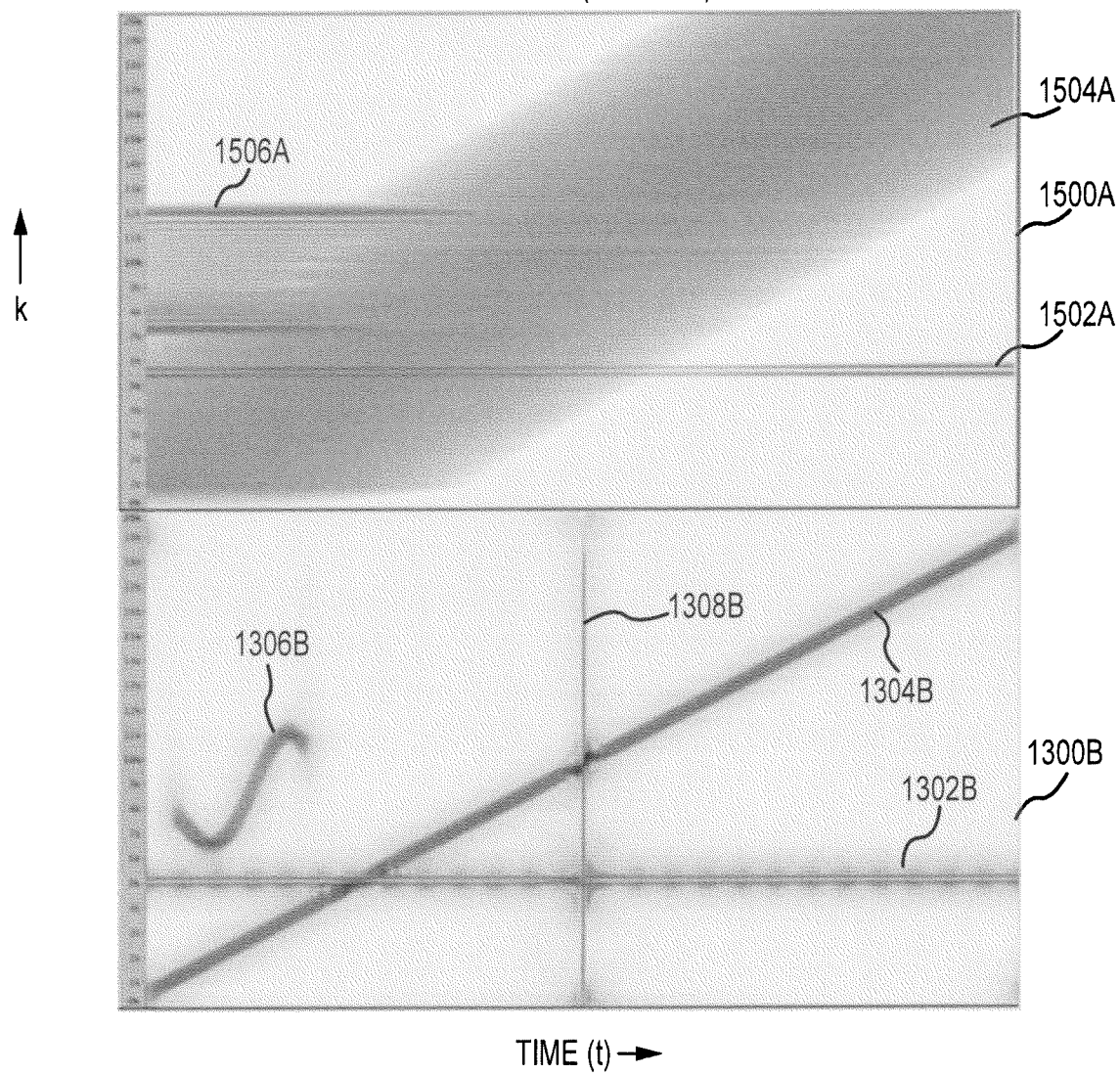
FIG. 15 illustrates a comparison between a same size SIFT sequence (top) and an adaptive reduced uncertainty transform (bottom), where N=4096 and both transforms have 10.77 Hz resolution per bin at a SR of 44.1 kHz, in accordance with embodiments of the present disclosure.

FIG. 15 illustrates a comparison between a same size SIFT sequence (top) and an adaptive reduced uncertainty transform (bottom), where N=4096 and both transforms have 10.77 Hz resolution per bin at a SR of 44.1 kHz in accordance with embodiments of the present disclosure. The STFT representation 1500A shows magnitude $|X_k|$ in a time-frequency domain. The STFT representation 1500A uses the same size or same frequency resolution as the adaptive reduced uncertainty transform and provides a high frequency resolution, but has a poor time resolution. Specifically, the STFT representation 1500A includes three components 1502A, 1504A, 1506A. The component 1502A is clear or has high frequency resolution. However, there is no spike corresponding to 1308B in the STFT representation 1500A. The time resolution is very poor in the STFT representation 1500A. In contrast, the spike 1308B is clear in adaptive reduced uncertainty transform representation 1300B. This indicates that the adaptive reduced uncertainty transform or adaptive time-frequency transform 1300B shows localized time domain features with higher resolution than the STFT transform 1500A. The other two components 1504A and 1506A also have much poorer resolution than components 1504B and 1506B shown in representation 1500B, respectively, such that the two components 1504A and 1506A have some overlap. In contrast, components 1304B and 1306B do not have any overlap as a result of high resolution in both time domain and frequency domain. As demonstrated above, the adaptive reduced uncertainty frequency transform can have a high resolution in both frequency domain and time domain. Conversely, the STFT transform can provide either a high frequency resolution with a poor time resolution or a high time resolution with a poor frequency resolution.

The present method may thus be used for sample-accurate spectral editing. The magnitudes and phases of the time-frequency transform can be adjusted to remove signals down to the duration of a single time domain sample from within the time-frequency domain. This method may be useful in removing clicks or other highly time localized signals. As an example of the application, a music record may have a scratch. The scratch may produce a click sound. The click sound may be similar to spike 408 as shown in FIG. 4D. By using frequency to time-frequency matrix extension and CFPC, the click sound generated from the scratch may be removed easily from the transform magnitudes before calculating the modified time domain representation f(t)'. For example, suppressing component 808 as shown in FIG. 8 would remove the spectral content 408 as shown in FIG. 4D. However, by displaying the signal in time-frequency domain (such as shown in FIG. 8 or FIG. 9), a user may select an unwanted part on the display by using a mouse to remove the unwanted part. By post processing the sound from the scratched record using the disclosed process, the scratched record becomes virtually scratch-free to an audience. The process virtually transforms the scratched record into a scratch free record. Because each frequency in the time domain has a single corresponding spectral line in the time-frequency domain, it is easy to manipulate, modify, suppress, or enhance spectral contents in a time-frequency domain to remove noises or scratches in the original input signal.

As illustrated above, high time resolution and high frequency resolution are possible by locally reducing the effects of the uncertainty principle that exists for periodic waves. The reason for this is that the present method applies smoothing or low pass filtering to change the individual partial waves from the periodic sinusoids into more complex, non-periodic wave packets, thereby shifting the energy concentration from the frequency domain to the time-frequency domain. The smoothing helps reduce the effects of the uncertainty principle in the frequency transform, because the original localization trade-off only applies to periodic sinusoidal waves, not to non-periodic wave packets.

Large reduced uncertainty transforms may require considerable memory and processing time when calculated explicitly. With the increased capacity and speed of present computers, the memory and processing time is less of a problem when the resolution in time domain needs to be improved. The matrix calculations can be performed by personal computer or other computing device including Single Instruction Multiple Data (SIMD) CPU extensions and Graphics Processing Units (GPUs). Since the smoothing stage may operate on successive time domain samples independently, the calculations may be efficiently implemented using parallel processing, for instance on a graphics card or on multiple processor cores. The smoothing method can easily and efficiently be implemented on a personal computer, either desktop, or laptop, to post process the frequency transform of any input signal. In the present method, CFPC describes a synchronization process that occurs between different neighboring frequency regions. CFPC processes can be simulated on a computer when signals include a multitude of frequencies.

Figure 16A:
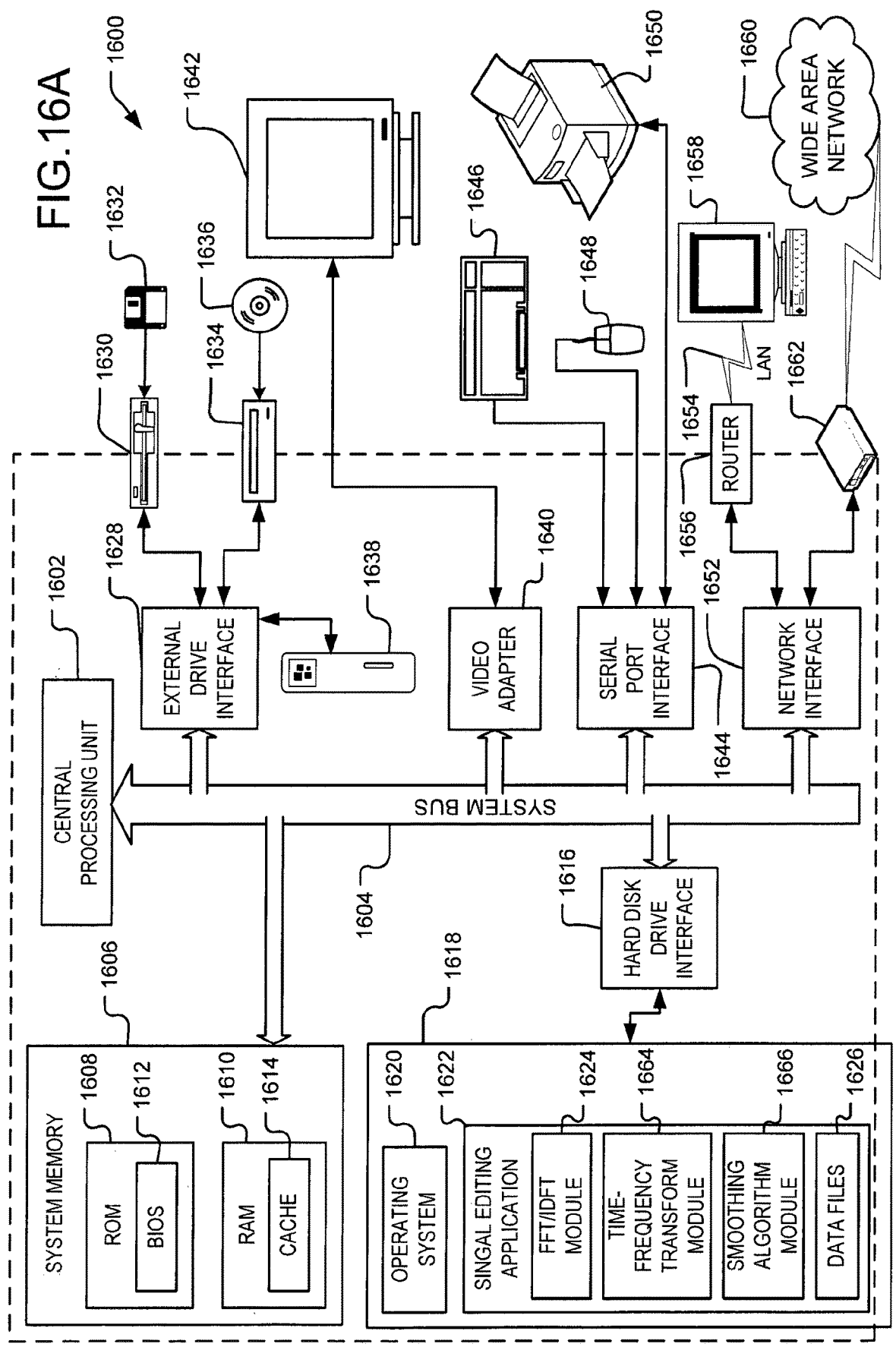
FIG. 16A is a schematic diagram of a special purpose computer system particularly configured for processing and modifying an input signal in accordance with embodiments of the present disclosure.

FIG. 15A is a simplified system diagram for processing an input signal in accordance with embodiments of the present disclosure. An exemplary computer system 1600 for implementing the signal processing and modifying processes above is depicted in FIG. 16A. The computer system 1600 of a sender or a recipient may be a personal computer (PC), a workstation connected to a central computer or server, a notebook or portable computer, a tablet PC, a handheld media player (e.g., an MP3 player), a smart phone device, a video gaming device, or a set top box, with internal processing and memory components as well as interface components for connection with external input, output, storage, network, and other types of peripheral devices. Internal components of the computer system in FIG. 16A are shown within the dashed line and external components are shown outside of the dashed line. Components that may be internal or external are shown straddling the dashed line. As an alternative to a PC, the computer system 1600, for example, for instantiating the signal processing and modifying methodologies described herein, may be in the form of any of a server, a mainframe computer, a distributed computer, an Internet appliance, or other computer devices, or combinations thereof.

In any embodiment or component of the system described herein, the computer system 1600 includes a processor 1602 and a system memory 1606 connected by a system bus 1604 that also operatively couples various system components. There may be one or more processors 1602, e.g., a single central processing unit (CPU), or a plurality of processing units, commonly referred to as a parallel processing environment (for example, a dual-core, quad-core, or other multi-core processing device). The system bus 1604 may be any of several types of bus structures including a memory bus or memory controller, a peripheral bus, a switched fabric, point to point connection, and a local bus using any of a variety of bus architectures. The system memory 1606 includes read only memory (ROM) 1608 and random access memory (RAM) 1610. A basic input/output system (BIOS) 1612, containing the basic routines that help to transfer information between elements within the computer system 1600, such as during start up, is stored in ROM 1608. A cache 1614 may be set aside in RAM 1610 to provide a high speed memory store for frequently accessed data.

A hard disk drive interface 1616 may be connected with the system bus 1604 to provide read and write access to a data storage device, e.g., a hard disk drive 1618, for nonvolatile storage of applications, files, and data. Note that the hard disk drive 1618 may be either an internal component or an external component of the computer system 1600 as indicated by the hard disk drive 1618 straddling the dashed line in FIG. 16. In some configurations, there may be both an internal and an external hard disk drive 1618. A number of program modules and other data may be stored on the hard disk 1618, including an operating system 1620, one or more application programs and data files.

In an exemplary implementation, the hard disk drive 1618 may store a signal editing application program 1622 as one of several programs that can turn the computer system 1600 into a number of special purpose machines. The signal editing application program 1622 may include a number of software modules that work together to perform various functions of the signal editing application program 1622. In an exemplary implementation, the signal editing application program 1622 may include a FFT/IDFT module 1624 that causes the CPU 1602 to transform a signal from the time domain to the frequency domain (e.g., using FFT logic implementing Equations (1) and (2)) and in reverse from the frequency domain to the time domain (e.g., using IDFT logic implementing Equation (8)).

The signal editing application program 1622 may also include a time-frequency transform module 1664 which configures the CPU 1602 to create the time-frequency matrix representations of the frequency data as partial individual waves, for example, according to Equation (3). The signal editing application program 1622 may further include a smoothing filter module 1666 which configures the CPU 1602 to provide cross frequency phase coupling of the waves in the time-frequency matrix output from the processes of time-frequency transform module 1664, for example, according to Equations (4)-(7). The smoothing filter module 1666 creates a CFPC to the time-frequency transform matrix and outputs the smoothed time-frequency transform, which may be stored temporarily in system memory 1606 or for later, long term access in a data file 1626 associated with the signal editing application program 1622. Additional data files 1626 associated with the signal editing application program 1622 may store operational parameters for each of the modules. For example, the smoothing filter module 1666 may apply an exponential moving average filter, such as shown in Equations (4) and (5). The smoothing filter module 1666 may use the signal-adaptive λ approach or a signal-invariant λ approach to generate a smoothed time-frequency transform. The values for λ and related parameters may be stored in the data files 1626.

In an alternative embodiment, the signal editing application program 1622 can be optimized to run on a graphics processing unit (GPU) card 1603 rather than a standard CPU 1602. A GPU card 1603 is a specialized computer hardware processing component that is designed to compute millions of values (usually pixel color and brightness values for display on a computer screen) in parallel from a computer model of an image (for example, like a 3D scene in a computer game) using a so-called "Shader". A Shader is a filter that combines input values, such as the tilt of a plane relative to a light source for all pixels on a screen, and receives data calls for millions of pixels on a screen at the same time, thereby allowing fast computation of an image from a 3D model. The signal editing application program 1622, including the time-frequency transform module 1664 and smoothing filter module 1666, can be modified to compute the smoothing values for the matrices using a Shader on the GPU card 1603 allowing the program to run efficiently at a very high speed, thus providing for a real-time display of the time-frequency representation.

The signal editing application program 1622 may also include signal editing tools for identifying and altering or removing unwanted energy or signal magnitude at certain frequencies in discrete time bins of the smoothed time-frequency transform. Such signal editing tools may include automatic low pass filters or it may provide for receipt of user input parameters or even a user interface to allow for direct editing of the time-frequency domain signal through a graphical user interface instantiated on the computer system 1600. Once any signal editing is complete, the edited signal may then be processed by the CPU 1602 according to the IFFT operations in the FFT/IFFT module 1624 to return a modified signal in the time domain.

The computer system 1600 may further include a magnetic disk drive 1630 for reading from or writing to a removable magnetic disk 1632, tape, or other magnetic media. The magnetic disk drive 1630 may be connected with the system bus 1604 via a drive interface 1628, for example, a Small Computer System Interface (SCSI), Serial Attached SCSI (SAS) interface, or Serial AT Attachment (SATA) interface, to provide read and write access to the magnetic disk drive 1630 initiated by other components or applications within the computer system 1600. The magnetic disk drive 1630 and the associated computer readable media may be used to provide nonvolatile storage of computer readable instructions, data structures, program modules, and other data for the computer system 1600.

The computer system 1600 may additionally include an optical disk drive 1634 for reading from or writing to a removable optical disk 1636 such as a CD ROM, DVD, or other optical media. The optical disk drive 1634 may be connected with the system bus 1604 via the drive interface 1628 to provide read and write access to the optical disk drive 1634 initiated by other components or applications within the computer system 1600. The optical disk drive 1630 and the associated computer readable optical media may be used to provide nonvolatile storage of computer readable instructions, data structures, program modules, and other data for the computer system 1600. The computer system 1600 may further include an external hard drive 1638 connected to the external drive interface 1628. The external hard drive 1638 may be used to provide additional nonvolatile storage of computer-readable instructions, data structures, program modules, and other data for the computer system 1600.

A display device 1642, e.g., a monitor, a television, or a projector, or other type of presentation device may also be connected to the system bus 1604 via an interface, such as a video adapter 1640 or video card. Similarly, audio devices, for example, external speakers or a microphone (not shown), may be connected to the system bus 1604 through an audio card or other audio interface (not shown).

In addition to the monitor 1642, the computer system 1600 may include other peripheral input and output devices, which are often connected to the processor 1602 and memory 1606 through the serial port interface 1644 that is coupled to the system bus 1606. Input and output devices may also or alternately be connected with the system bus 1604 by other interfaces, for example, a universal serial bus (USB), an IEEE 1394 interface ("Firewire"), a parallel port, or a game port. A user may enter commands and information into the computer system 1600 through various input devices including, for example, a keyboard 1646 and pointing device 1648, for example, a mouse. Other input devices (not shown) may include, for example, a joystick, a game pad, a tablet, a touch screen device, a satellite dish, a scanner, a facsimile machine, a microphone, a digital camera, and a digital video camera.

Output devices may include a printer 1650 and one or more loudspeakers 1670 for presenting the audio performance of the sender. Other output devices (not shown) may include, for example, a plotter, a photocopier, a photo printer, a facsimile machine, and a press. In some implementations, several of these input and output devices may be combined into single devices, for example, a printer/scanner/fax/photocopier. It should also be appreciated that other types of computer readable media and associated drives for storing data, for example, magnetic cassettes or flash memory drives, may be accessed by the computer system 1600 via the serial port interface 1644 (e.g., USB) or similar port interface.

The computer system 1600 may operate in a networked environment using logical connections through a network interface 1652 coupled with the system bus 1604 to communicate with one or more remote devices. The logical connections depicted in FIG. 16 include a local area network (LAN) 1654 and a wide area network (WAN) 1660. Such networking environments are commonplace in home networks, office networks, enterprise wide computer networks, and intranets. These logical connections may be achieved by a communication device coupled to or integral with the computer system 1600. As depicted in FIG. 16, the LAN 1654 may use a router 1656 or hub, either wired or wireless, internal or external, to connect with remote devices, e.g., a remote computer 1658, similarly connected on the LAN 1654. The remote computer 1658 may be another personal computer, a server, a client, a peer device, or other common network node, and typically includes many or all of the elements described above relative to the computer system 1600.

To connect with a WAN 1660, the computer system 1600 typically includes a modem 1662 for establishing communications over the WAN 1660. Typically the WAN 1660 may be the Internet. However, in some instances the WAN 1660 may be a large private network spread among multiple locations, or a virtual private network (VPN). The modem 1662 may be a telephone modem, a high speed modem (e.g., a digital subscriber line (DSL) modem), a cable modem, or similar type of communications device. The modem 1662, which may be internal or external, is connected to the system bus 1618 via the network interface 1652. In alternate embodiments the modem 1662 may be connected via the serial port interface 1644. It should be appreciated that the network connections shown are exemplary and other means of and communications devices for establishing a network communications link between the computer system and other devices or networks may be used.

The computer system 1600 may include multiple processors or multiple processor cores and an algorithm to instruct the processors to perform parallel processing. For example, the single computer CPU 1602 may include multiple processor cores. Alternatively, multiple connected computers may be used. Each computer may include at least one processor. By parallel processing, the efficiency may be significantly improved. Some fast smoothing algorithms may be available on modern CPUs or GPUs. For example, when the transforms provide a real valued output, a Hilbert transform may be applied to convert the values into an analytic (complex-valued) signal before processing. The algorithms for spectral manipulation based on FFT or frequency transform processing may also be used.

The technology described herein may be implemented as logical operations and/or modules in one or more computing systems configured for special purpose processing of the signal processing and editing methodologies disclosed herein. The logical operations may be implemented as a sequence of processor-implemented steps directed by software programs executing in one or more computer systems or as interconnected machine or circuit modules using logic gates in either a standalone device or within one or more computer systems, or as a combination of both a software configured microprocessor and circuit modules. Likewise, the descriptions of various component modules may be provided in terms of operations executed or effected by the modules. The resulting implementation is a matter of choice, dependent on the performance requirements of the underlying system implementing the described technology. Accordingly, the logical operations making up the embodiments of the technology described herein are referred to variously as operations, steps, objects, or modules. Furthermore, it should be understood that logical operations may be performed in any order, unless explicitly claimed otherwise or a specific order is inherently necessitated by the claim language.

In some implementations, articles of manufacture are provided as computer program products that cause the instantiation of operations on a computer system to implement the invention. One implementation of a computer program product provides a non-transitory computer program storage medium readable by a computer system and encoding a particular and unique processing algorithm on the computer to create a special purpose computer. It should further be understood that the described technology may also be employed in special purpose devices independent of a personal computer.

Figure 16B:
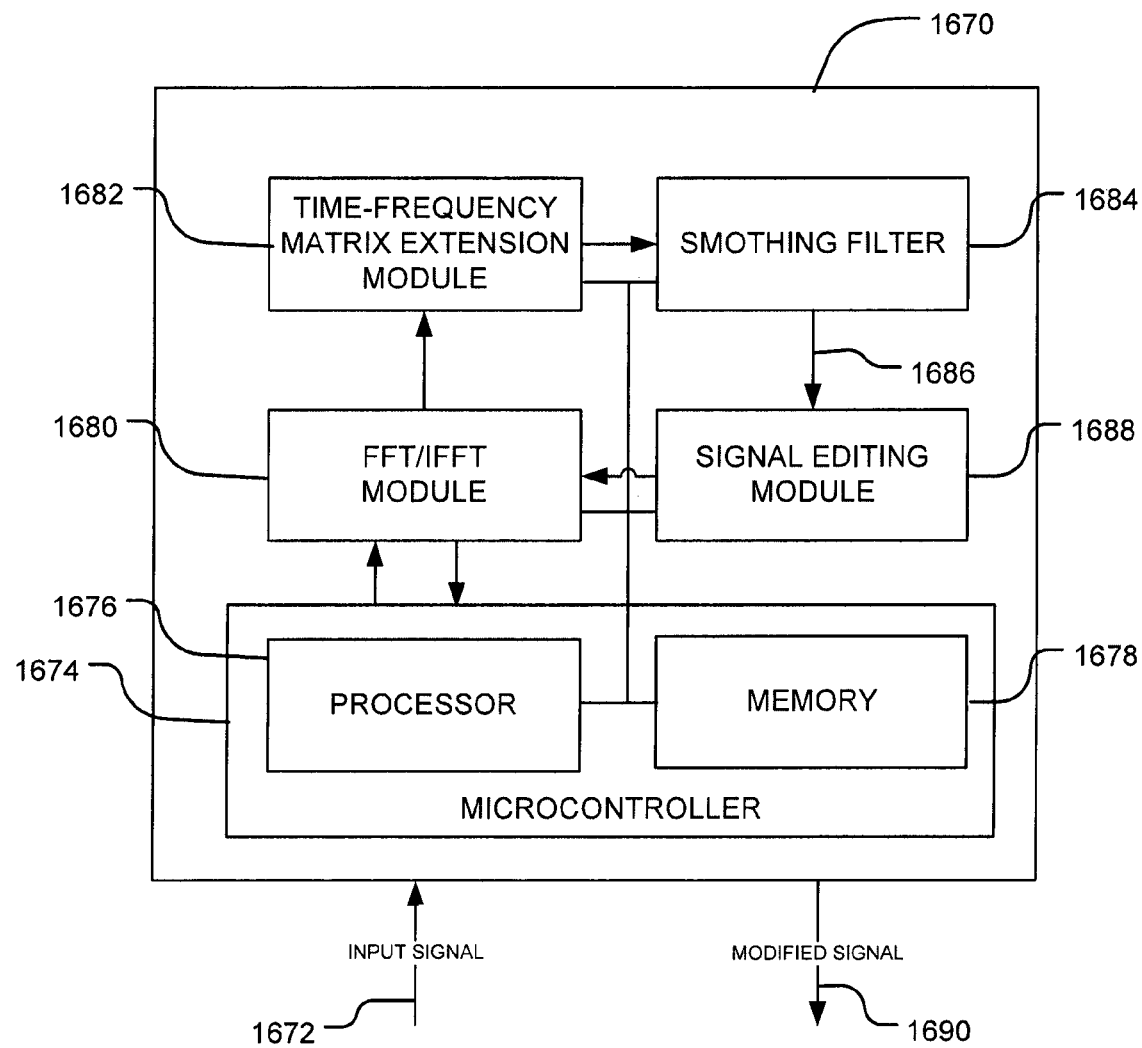
FIG. 16B is a simplified system diagram for a processing device for modifying an input signal in accordance with embodiments of the present disclosure.

For example, the signal processing system disclosed herein may be implemented on a special purpose processing device 1670 as shown in FIG. 16B. The processing device 1670 may include a microcontroller 1674 combining a processor 1676 and memory 1678. In an alternate embodiment, separate microprocessors and memory devices may be operatively coupled together. Alternatively, if additional memory is required, a separate memory module could be coupled to the microcontroller 1674. The memory 1678 may be used to store an input signal 1672 for processing and, ultimately, a modified signal 1690 for output. The memory 1678 may further be used to store various parameters for processing steps by the various circuit modules described below as well as output data and values from the circuit modules. The microcontroller 1674 manages the data flow to and from the memory 1678 and coordinates the processing steps by the various circuit modules. In some implementations, the microcontroller 1674 may be configured to perform the processing operations of one or more of the circuit modules.

A number of circuit modules may be connected to the microcontroller 1674 within the device 1670. These circuit modules may be implemented, for example, using an Application-specific Integrated Circuit (ASIC), or a Field-programmable Gate Array (FPGA). The circuit modules may include a time-frequency transform module 1680 that is configured to transform a signal from the time domain to the frequency domain (e.g., a FFT logic circuit implementing Equations (1) and (2)) and in reverse from the frequency domain to the time domain (e.g., an IDFT logic circuit implementing Equation (8)). The microprocessor 1674 may be configured to direct the input signal 1672 to the transform module 1680, which applies an FFT to the input signal 1672. A second circuit module may be a time-frequency matrix extension module 1682 in which logic gates are configured to create the time-frequency matrix representations of the frequency data, for example, according to Equation (3). Alternatively, the memory 1678 may store the algorithms and associated data to instruct the processor 1676 to perform frequency transform of the input signal 1672, for example, as shown in Equations (1) and (2), and generate time-frequency transform matrices or partial individual waves, for example, as shown in Equation (3), obviating the need for separate transform circuit modules.

A third circuit module may be a smoothing filter module 1684 in which logic gates are configured to provide cross frequency phase coupling, for example, according to Equations (4)-(7): In some embodiments, the smoothing filter module 1684 may be a computer graphics co-processor. The smoothing filter module 1684 may receive the output from the time-frequency transformmatrix module 1682. The smoothing filter module 1684 creates a CFPC to the time-frequency transform matrix and outputs the smoothed time-frequency transform 1686 to the memory 1678. The smoothing filter module 1684 may apply an exponential moving average filter, such as shown in Equations (4) and (5). The smoothing filter module 1684 may use the signal-adaptive λ approach or a signal-invariant λ approach to generate the smoothed time-frequency transform 1686.

One or more additional circuit modules, for example, a signal editing module 1684 may also be included in the device for identifying and altering or removing unwanted energy or signal magnitude at certain frequencies in discrete time bins. Such a signal editing module 1684 may be as simple as a low pass filter circuit or it may provide for receipt of user input parameters or even a user interface and tools to allow for direct editing of the time-frequency domain signal. Once any editing in the signal editing module 1684 is complete, the edited signal may then be transmitted back to the transform module 1680 to perform an inverse transform (e.g., an Inverse Discrete Fourier Transform) and return a modified signal 1690 in the time domain. The processor 1676 can direct that the modified signal 1690 be stored in the memory 1678 or output for use or rendering by other devices. The processing device 1670 may thus receive an input signal 1672 in the time domain and output a modified time domain signal 1690 after processing the input signal 1672 by using the methodologies described above.

Figure 17:
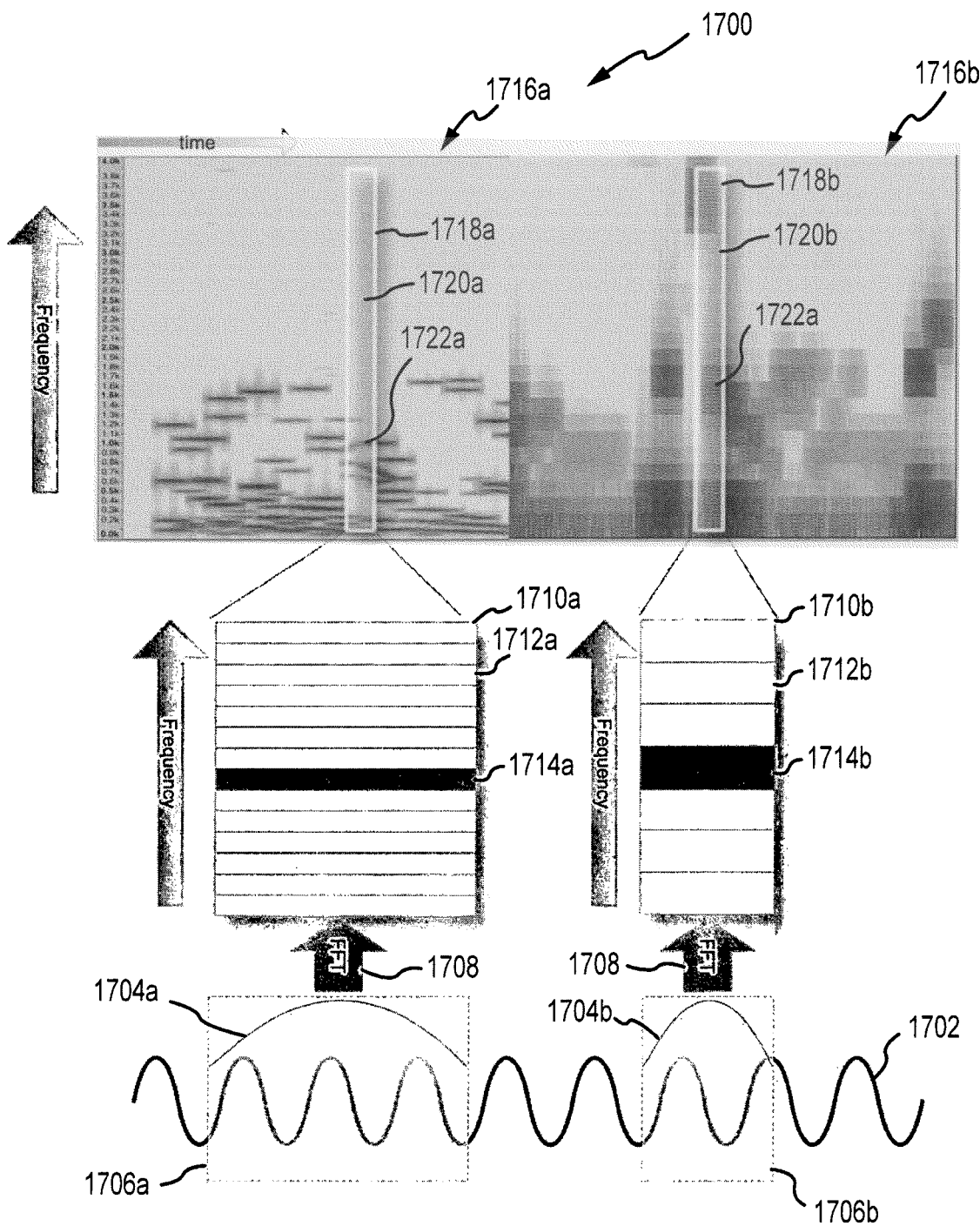
FIG. 17 is an exemplary illustration of a prior art processing method for transforming a signal from the time domain to the frequency domain for spectral editing.
Figure 18:
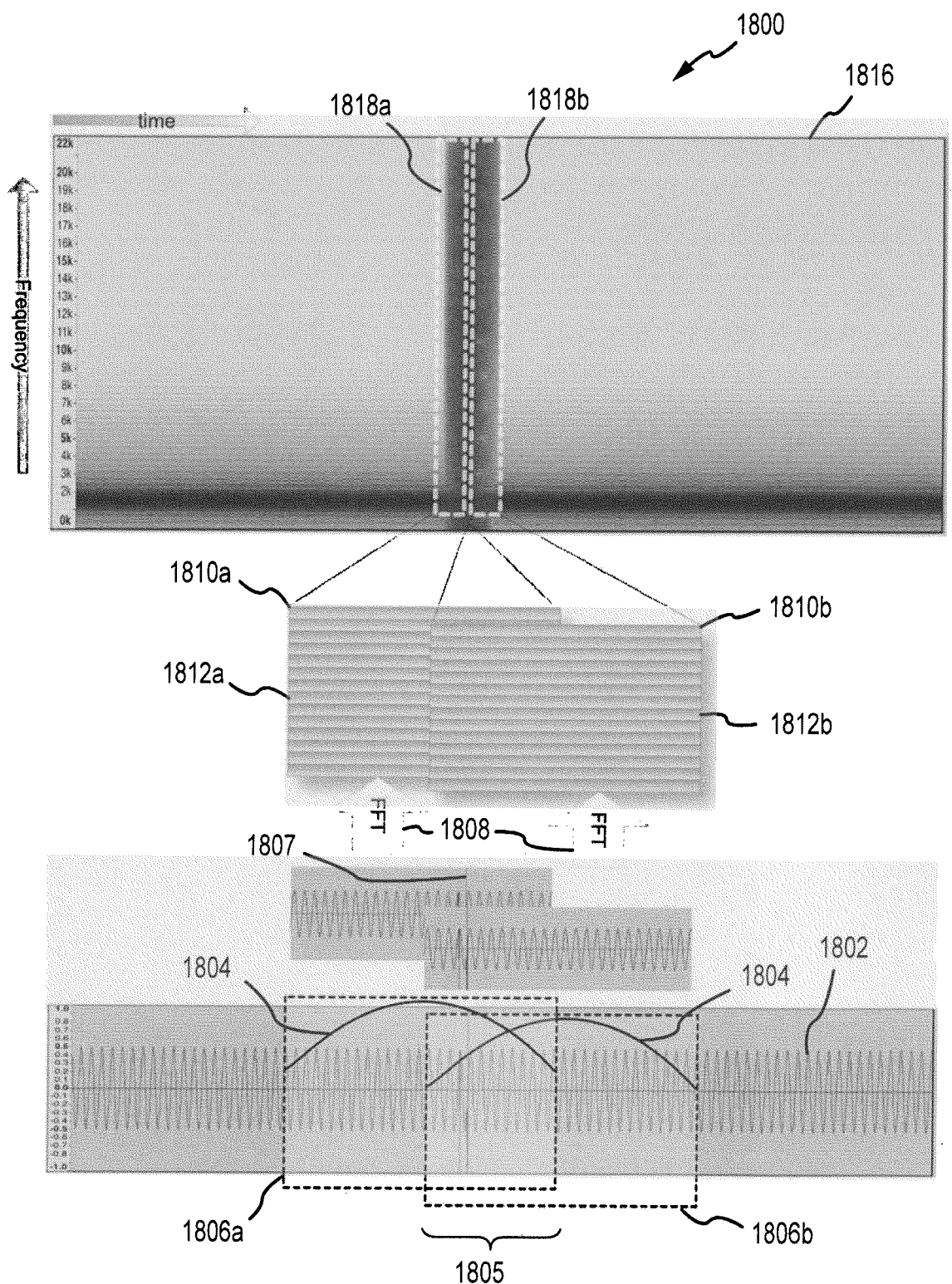
FIG. 18 is an exemplary illustration of a prior art STFT overlapping windowing method for transforming a signal from the time domain to the frequency domain for spectral editing.

An exemplary signal editing process that may use the time-frequency matrix extension to remove unwanted noise or other frequency aberrations from a signal can be understood with reference to FIGS. 16-19. FIGS. 16-18 schematically represent state of the art signal processing methods for purposes of comparison with FIG. 19, which schematically represents the time-frequency matrix extension process disclosed herein. The examples of FIGS. 16-19 may be understood in the context of audio signal processing; however, the present method may be applied to any signals that can be represented as a series of measured spatio-temporal values, such as audio, static image files, and video, or measurements from other signals like radio, television, and satellite transmissions; RADAR and SONAR; landline and wireless telephone and data signal transmissions; radio telescope-received signals; geophysical mapping signals; and tomography and magnetic resonance imaging, amongst others. Therefore, in addition to the audio processing example presented herein, signal processing using these techniques is possible in any number of disciplines and applications.

A schematic representation of a traditional spectral editing process 1700 is presented in FIG. 17. A sinusoidal time domain signal 1702 is the subject of the editing process 1700. An input signal may be converted into a digital representation ("sampled") by using analog to digital (A/D) conversion. Alternatively, an input signal may be a computer data file containing a sampled signal that was sampled at an earlier point in time. The input signal captured may be any signal type that represents a series of time versus amplitude or intensity measurements. Typically, portions of the time domain signal 1702 are "windowed" or selected for further analysis and editing by transformation into the frequency domain. There is no particular size requirement for a sampling window. For example, a windowing function 1704a could be set with parameters to select a large window 1706a for analysis or a windowing function 1704b could be set with alternate parameters to select a relatively smaller window 1706b for analysis.

Each window thus selected is then subjected to an FFT operation 1708 (e.g., a STFT) to translate the time domain signal into the corresponding frequency domain representation. Depending upon the size of the window chosen for analysis, the resolution of the representation in the frequency domain will be affected pursuant to the uncertainty principle, i.e., both high temporal resolution and high frequency resolution cannot be achieved at the same time. In particular, the larger the sample window from the time domain is, the better or narrower the resolution of frequencies in the frequency domain, but at a cost of resolution in the time domain. This is because the resolution of the FFT is the sample frequency divided by the number of samples (i.e., the window length).

The FFT operation 1708 yields a series of values corresponding to a spectrum of frequencies within the range of the FFT operation 1708, which may be represented graphically as a "stack" 1710a/b (the series) of "bins" 1712a/b (the discrete frequency values). Bins 1712a/b with signal energy 1714a/b at particular frequencies may be highlighted or darkened to contrast with empty bins having no signal energy at the particular frequency associated with the bin. Note that the discrete frequencies identified by the FFT operation 1708 represented in bins 1712a in stack 1710a have much narrower bands, and thus higher resolution, when the large sample window 1706a is used, as compared to the wider bands of the bins 1712b in stack 1710b when the large sample window 1706a is used, which have a lower resolution, i.e., the frequency band in which the signal energy is recorded is relatively wide and cannot be further narrowed or refined.

The bins 1710a/b may be represented on a display screen as columns 1718a/b of signal intensity at various frequencies plotted against time in frequency domain plots 1716a/b. The schematic representation of the plot 1716a corresponding to the large sample window 1706*a* is presented in conjunction with the plot 1716*b* corresponding to the small sample window 1706*b* for comparison. Signal energy 1722*a/b* in a particular frequency sample band can be represented by different numbers or colors of pixels on the display screen in each bin, or by any number of other visual representation schemes. Each column 1718*a/b* represents one transform frame from one of the windows 1706*a/b*, which corresponds to an average frequency/magnitude estimate over N time domain samples (i.e., sample frequency). Larger values for N provide better resolution in the frequency domain (i.e., more vertical columns 1618*a* over a given time frame). In contrast, smaller values for N provide better resolution in the time domain but fewer frequency bins (fewer vertical columns 1718*a* over a given time frame).

Another schematic representation of a standard spectral editing process 1800 is shown in FIG. 18 to highlight a common analysis procedure for a signal 1802 with noise 1807. In a typical analysis and editing process 1800, the sampling function 1804 is the same for each sample length and the sample windows 1806*a/b* are thus of constant size. The sample windows 1806*a/b* are further configured to overlap (see overlapping area 1805), usually by 50% or more. The FFT operation 1808 operates on each sample window 1806*a/b* and yields a series of values corresponding to a spectrum of frequencies within the range of the FFT operation 1808, which may be represented graphically as a "stack" 1810*a/b* (the series) of "bins" 1812*a/b* (the discrete frequency values). Note that the discrete frequencies identified by the FFT operation 1808 represented in bins 1812*a* in stack 1810*a* have the same resolution as the bins 1812*b* in stack 1810*b*. This is because the sample windows 1806*a/b* are the same size and the parameters of the FFT operation 1808 are the same for each sample.

The bins 1810*a/b* may be represented on a display screen as columns 1818*a/b* of signal intensity at various frequencies plotted against time in a single frequency domain plot 1816. Each column 1818*a/b* represents one transform frame from one of the 1806*a/b*, which corresponds to an average frequency/magnitude estimate over N time domain samples (i.e., sample frequency). Note, however, that adjacent columns 1818*a/b* represent adjacent transform frames corresponding to overlapping windows 1806*a/b* and thereby different, but overlapping, periods of time, each N/SampleRate seconds in duration. As a result of the overlap 1805 and the size of each window 1806*a/b*, each time domain sample, including any transient signals such as noise 1807, occurs in more than one window 1806*a/b*. Thus, any transient or noise signal 1807 is spread over multiple time instances in the frequency domain, thereby making precise editing of the noise difficult 1807. Once editing is complete, the modifications in the frequency domain may then be converted back to a time-domain representation by an inverse frequency transform.

Figure 19:
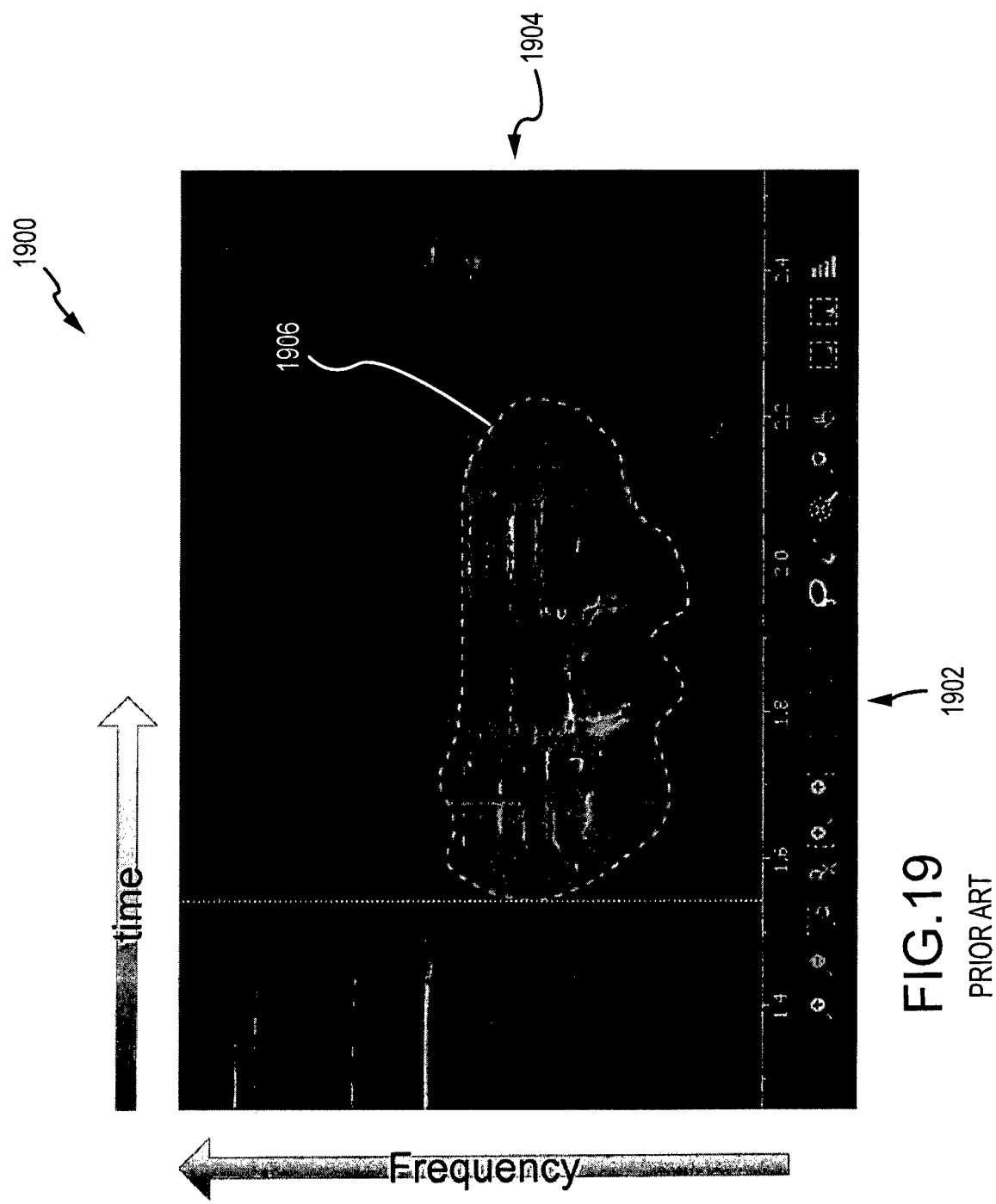
FIG. 19 is an exemplary illustration of a prior art spectral editing tool environment for editing or modifying a signal transformed into the frequency domain

FIG. 19 depicts a screenshot of a typical audio editing application 1900. The application 1900 presents frequency domain transformations of audio signals 1904 for analysis and editing in a window and provides editing tools 1902 for manipulation of the signals. The user manipulates pixels on the screen using the editing tools 1902 to change the signal energy for each time domain sample at particular frequencies. The image in FIG. 19 shows a representative manipulation area 1906 selected across multiple samples and frequencies for application of a treatment provided by the editing tools 1902. In this example, a region of support (ROS) is defined by an arbitrarily shaped boundary around the frequencies and the region outside the ROS may be suppressed or extracted either manually or automatically.

The smallest editing resolution may be one pixel. However, each pixel still represents at least a portion of the results from analyzing one window, i.e., more than one time domain sample. Hence, all editing operations affect at least N time domain samples, i.e., the number of discrete samples in each sample window separated and operated on by the FFT 1808. Time-limited events (e.g., transients or noise 1807 depicted in FIG. 18) that are closer together than the overlapping region 1805 will be impossible to edit separately and will be treated equally. For example, reduction of signal strength at a particular frequency through the editing process to remove noise 1807 thus results in dampening of the signal at the edit frequency over a longer period of time than the period in which the noise occurs.

Figure 20:
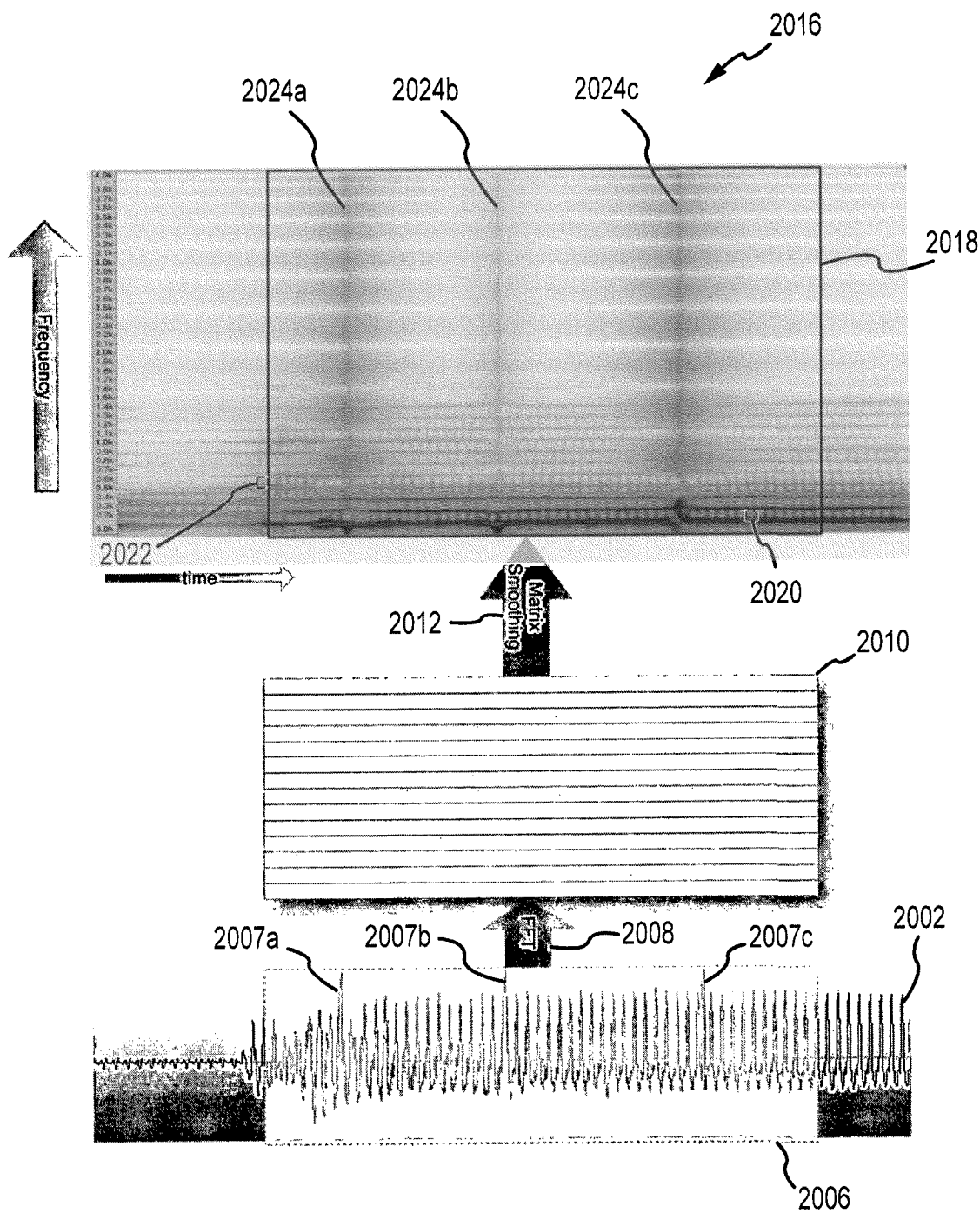
FIG. 20 is an exemplary illustration of processing method for transforming a signal from the time domain to the time-frequency domain for spectral editing in accordance with embodiments of the present disclosure.

Application of the time-frequency matrix process disclosed herein in the context of an editing tool 2000 is depicted in FIG. 20. In this editing tool 2000, windowing in the time domain is entirely optional, as the analysis transform size is arbitrary and can encompass the entire region of interest, or individual pieces of the signal 2002. Once the FFT 2008 is applied to the portion of the signal 2002 and in the window 2006 and the matrix smoothing algorithm 2012 is applied to the frequency bin stack 2010 created by the FFT 2008 as described above, the resulting time-frequency transform data may be displayed visually as an image representation 2016, where a vertical axis may represent frequency, and a horizontal axis may represent time, or vice versa.

Pixel color and brightness may be used to display signal magnitude at any given screen coordinate (e.g., as a "spectrogram"). This spectrogram is a common method of displaying frequency domain data for direct manipulation by a user through manual selection tools, and by applying various secondary processes to the then-selected data. Conventional spectrogram editing processes do not allow manipulation of the spectral content of the represented signal on a sample-by-sample level, limiting edits to the extent of the individual STFT transform frames. The present method enables editing operations on segments of data arbitrarily small along both the time axis and frequency axis (i.e., high time resolution and high frequency resolution), including the ability to edit segments of the duration of a single spatio-temporal value in the source signal (i.e., "sample accurate").

In the example editing tool 2000, each column represents one time domain division (i.e., one sample), not an entire analysis frame. Vertical resolution depends on the frame size or window 2006 chosen for application of the FFT 2008. Again, analysis windows 2006 do not need to overlap. Larger values for N provide better resolution in the frequency domain (i.e., more vertical pixels). Adjacent columns of pixels 2020 represent adjacent time domain increments or partitions, each of which is 1/SampleRate seconds in duration. Horizontal pixel bands 2022 correspond to frequency bins of signal energy at each time domain increment and have a resolution corresponding to the number N of time domain sample samples. Time limited transient or noise signals 2007*a/b/c* appear as discrete objects 2024*a/b/c* (i.e., vertical lines) in specific time instances or bins and can be manipulated separately from each other independent of window size.

With the example editing tool 2000, the user may manipulate pixels using the same editing tools typically found in image processing applications (e.g., as in FIG. 18). Thus, the signal processing methods may be configured as a drop-in replacement for other editing tool algorithms that provides better resolution. A user may select parts of the spectrogram representation of the signal and modify them using selection tools as used in image processing, or machine aided selection tools, or through parametric selection methods based on signal criteria. As examples, the signal may be an audio signal. In one embodiment, the signal components may include reverb, reflections, and/or echoes. These signals may be identified, separated, and modified. In another embodiment, the signal components may be voice, speech, and/or non-speech components. In a further embodiment, the signal components may be noise and components which contain useful information. In yet another embodiment, the signal components may be of a user definable type to be separated from other signals. In still yet another embodiment, the signal components may include, but not be limited to, wireless transmission signals, image files, or video files among others. The smallest editing resolution may be one pixel.

Alternatively, automatic parametric selection/modification routines may be used to replace the manual procedure by the user. For example, in the prior art searching for a time-frequency pattern embedded in noise using a STFT sequence may require multiple transform frames with a high degree of overlap between successive STFT transform frames, or a high degree of freedom in the comparison criteria. By using the present method in combination with pattern detection algorithms, the pattern may be separated from the noise and a pattern detector may more reliably detect a given pattern. The reason for this is that in the present method, frequency resolution depends upon the transform size N, which may be an arbitrarily large number. Time resolution depends on local time-frequency localization parameter λ and is therefore locally variable. Automatic pattern detection software can thus be employed within the time-frequency domain to automatically edit out unwanted signal components. Exemplary automatic editing tools include UNMIX::DRUMS (Zynaptiq, Germany), which detects patterns corresponding to drums in an audio mix and automatically attenuates or boosts them depending upon preselected parameters, and UNVEIL (Zynaptiq, Germany), which uses pattern detection to detect and remove reverb from a signal.

The modifications in the time-frequency domain may then be converted back to a time-domain representation by an inverse frequency transform (e.g., as shown in Equation 8). Alternatively, the modification may be stored on disk in either transformed or direct (time domain) data for later retrieval and further modification. The modified time domain sample may be reproduced by a digital to analog (D/A) conversion. Alternatively, the modified time domain sample may be stored on a computer as a digital data file, which may be converted via D/A at a later time.

It will be appreciated by those skilled in the art that the method may have applications in numerous other fields as well, such as electronics, physics, image processing, and generally all fields that make use of FFT or related frequency transforms for spectral analysis.

It will be recognized by those skilled in the art that the present method may be used as a drop-in replacement for, or in conjunction with, existing techniques and algorithms ordinarily based on the Fourier transform with little to no change to the processing algorithm. For instance, the present method can be used to convert each SIFT analysis frames into N sub-frames at unity stride (i.e., one transform per time domain sample). These sub-frames can each be treated as a full resolution FFT, and FFT-based algorithms can be applied.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which; as a matter of language, might be said to fall therebetween.

What is claimed is:

1. A method for processing an electromagnetic signal to identify unwanted signal features in discrete signal samples comprising
   generating via a particularly configured microprocessor a time-frequency representation of an input signal by
      receiving the input signal as a plurality of transform frames in a time domain, wherein each transform frame includes a plurality of signal samples corresponding to discrete time instances across each transform frame;
      converting each transform frame to a frequency domain using a frequency transform, wherein the input signal is represented on a grid of frequency bands by phase and magnitude measurements for each frequency band;
      formulating matrices with a frequency axis and a time axis containing sinusoidal waves corresponding to real and imaginary parts of the frequency, magnitude, and phase information across each transform frame, wherein each sinusoidal wave extends over an entire time domain duration of N samples of the transform frame;
   applying a smoothing filter along the frequency axis of the matrices to introduce synchronization between adjacent frequency regions for each discrete signal sample to smooth the matrices along the frequency axis, such that the energy of waves from the adjacent frequency regions leak into each other, wherein unwanted signal features are magnified in corresponding frequency bands of the smoothed time-frequency representation for each time instance in which the unwanted signal features occurred in the input signal in the time domain;
   formulating time-frequency magnitudes and phases from the smoothed matrices; and
   outputting for storage in a memory device coupled to the microprocessor or displaying on a display device coupled to the microprocessor values or representations, or both, of the time-frequency magnitudes and phases that highlight unwanted signal features in individual frequency bands for discrete signal samples.

2. The method of claim 1 further comprising
   modifying the time-frequency magnitudes and phases via the microprocessor;
   inversely transforming via the microprocessor the modified time-frequency magnitudes and phases into a modified time domain representation of the input signal; and
   outputting the modified time domain representation from the microprocessor.

3. The method of claim 2, wherein the modifying operation further comprises
identifying an unwanted signal in the modified time-frequency magnitudes and phases; and
altering a magnitude or phase, or both, of the unwanted signal.

4. The method of claim 3 further comprising using an automatic pattern detection process implemented by the microprocessor to perform the steps of identifying and altering.

5. A method implemented in a computer system for processing a digitized electromagnetic signal to identify unwanted signal features comprising
generating via a particularly configured microprocessor a modified time-frequency representation of an input signal by
receiving the input signal as a plurality of transform frames in a time domain in the microprocessor, wherein each transform frame includes a plurality of signal samples;
transforming each transform frame of the input signal into a frequency domain using a frequency transform;
introducing a time dimension into the frequency transform to generate constant frequency and constant magnitude periodic partial waves for each frequency band of the frequency transform of the input signal for each of the transform frames to form a time-frequency representation for each transform frame;
applying a smoothing filter to the time-frequency representation to introduce synchronization between the periodic partial waves of adjacent frequency bands and to generate a smoothed time-frequency representation that includes non-periodic wave packets across the frequency bands converted from the periodic partial waves by the synchronization, wherein unwanted signal features are magnified in corresponding frequency bands of the smoothed time-frequency representation for each signal sample in which the unwanted signal features occurred in the input signal in the time domain;
formulating time-frequency values from the non-periodic wave packets for each frequency band in each signal sample; and
displaying on a display device within the computer system the time-frequency values or representations thereof, or both, identifying the unwanted signal features in discrete time samples.

6. The method of claim 5 further comprising editing the time-frequency values to modify unwanted signal features in the smoothed time-frequency representation.

7. The method of claim 5 further comprising
generating a modified time domain signal of the edited time-frequency values via the microprocessor; and wherein
the displaying step further comprises displaying the modified time domain signal as a representation on a display device.

8. A non-transitory computer readable storage medium containing instructions for instantiating a special purpose computer to process a digitized electromagnetic signal to remove unwanted signal features from the electromagnetic signal, wherein the instructions implement a computer process comprising the steps of
receiving the input signal comprising a plurality of transform frames in a time domain;
transforming the input signal into a frequency domain using a frequency transform;
generating time-frequency matrices corresponding to respective transform frames from the frequency transform containing basis functions of the frequency transform adjusted for respective transform magnitudes and phases, wherein the time-frequency matrices have a first dimension of time in instances of sample time t and a second dimension of frequency in bandwidth bins k for each transform frame;
applying a cross-frequency phase coupling processing algorithm between adjacent frequencies to introduce synchronization between the adjacent frequencies and to generate smoothed time-frequency matrices, wherein unwanted signal features are magnified in corresponding bandwidth bins k of the smoothed time-frequency matrices for each time sample tin which the unwanted signal features occurred in the input signal in the time domain; and
outputting for storage or for display on a display device time-frequency values or representations thereof, or both, from the smoothed time-frequency matrices identifying the unwanted signal features for relevant time samples t.

9. The non-transitory computer readable storage medium of claim 8, wherein the instructions implement further process steps comprising
formulating time-varying magnitudes and phases from the smoothed time-frequency matrices for each sample time t and each bandwidth bin k in each transform frame; and
modifying the time-varying magnitudes and phases to edit the unwanted signal features for the time samples tin relevant bandwidth bins k.

10. The non-transitory computer readable storage medium of claim 9, wherein the step of modifying the time-varying magnitudes and phases in a time-frequency domain results in manipulation of spectral content in the time domain and the frequency domain with respect to discrete time samples t.

11. The non-transitory computer readable storage medium of claim 9, wherein the instructions implement a further process step comprising
forming modified time-frequency matrices from the modified time-varying magnitudes and phases;
generating a modified time domain signal of the input signal from the modified time-frequency matrices which reflect edits to the unwanted signal features; and wherein
the outputting step further comprises outputting the modified time domain signal for storage or for display on a display device.

12. The non-transitory computer readable storage medium of claim 11, wherein the step of generating a modified time domain signal further comprises inversely transforming the smoothed time-frequency matrices to generate a modified time domain representation of the input signal.

13. The non-transitory computer readable storage medium of claim 8, wherein the generation of the smoothed time-frequency matrices further comprises
selecting a local time-frequency localization parameter; and
generating the smoothed time-frequency matrices based upon the selected local time-frequency location parameter.

14. The non-transitory computer readable storage medium of claim 13, wherein the step of generating a modified time domain signal further comprises inversely transforming the smoothed time-frequency matrices to generate a modified time domain representation of the input signal; and the modified time domain representation of the input signal has a time resolution that depends upon the local time-frequency localization parameter and a frequency resolution that depends upon a size of the frequency transform.

15. The non-transitory computer readable storage medium of claim 13, wherein the local time-frequency localization parameter is equal to or greater than 0 and less than 1.

16. The non-transitory computer readable storage medium of claim 13, wherein the generation of the smoothed time-frequency matrices further comprises varying the local time-frequency localization parameter to calculate the smoothed time-frequency matrices; and selecting the local time-frequency localization parameter that generates a maximum transformed magnitude.

17. The non-transitory computer readable storage medium of claim 16, wherein the step of varying the local time-frequency localization parameter further comprises varying the local time-frequency localization parameter in proportion to 1/frequency curve to yield a better frequency resolution for low frequencies and a better time resolution for high frequencies.

18. The non-transitory computer readable storage medium of claim 16, wherein the step of varying the local time-frequency localization parameter further comprises varying the local time-frequency localization parameter in proportion to a whitened magnitude spectrum $|X_k|'$, such that a low peak-to-local-average ratio in magnitude results in relatively high local time-frequency parameter to achieve a relatively high time resolution, and a high peak-to-local-average ratio in magnitude results in relatively low local time-frequency parameter to achieve a relatively high frequency resolution.

19. The non-transitory computer readable storage medium of claim 16, wherein the step of varying the local time-frequency localization parameter further comprises varying the local time-frequency localization parameter at a constant increment.

20. The non-transitory computer readable storage medium of claim 8, wherein the step of applying the cross-frequency phase coupling processing algorithm further comprises mixing a portion of waves in each frequency band with waves in adjacent frequency bands.

21. The non-transitory computer readable storage medium of claim 8, wherein each time-frequency matrix has a size of N by (N/2+1), where N represents a number of time samples t in each transform frame.

22. The non-transitory computer readable storage medium of claim 8, wherein the step of applying cross-frequency phase coupling further comprises applying low pass filtering by one or more of an exponential moving averaging filter, a finite impulse response (FIR) filter, an infinite impulse response filter, a rank order filter, a smoothing filter, or an adaptive filter.

* * * * *